(12) United States Patent
Yang

(10) Patent No.: US 8,421,082 B1
(45) Date of Patent: Apr. 16, 2013

(54) INTEGRATED CMOS AND MEMS WITH AIR DIELECTRIC METHOD AND SYSTEM

(75) Inventor: Xiao "Charles" Yang, Cupertino, CA (US)

(73) Assignee: MCube, Inc., San Jose, CA (US)

( * ) Notice: Subject to any disclaimer, the term of this patent is extended or adjusted under 35 U.S.C. 154(b) by 155 days.

(21) Appl. No.: 13/008,870

(22) Filed: Jan. 18, 2011

Related U.S. Application Data

(60) Provisional application No. 61/296,432, filed on Jan. 19, 2010.

(51) Int. Cl.
*H01L 27/108* (2006.01)

(52) U.S. Cl.
USPC ........................ 257/69; 257/288; 257/E21.421

(58) Field of Classification Search ............... 257/69, 257/288, E21.421
See application file for complete search history.

(56) References Cited

U.S. PATENT DOCUMENTS

| | | | |
|---|---|---|---|
| 6,188,322 B1 | 2/2001 | Yao et al. | |
| 6,979,872 B2* | 12/2005 | Borwick et al. | ............. 257/415 |
| 2002/0072163 A1 | 6/2002 | Wong et al. | |
| 2003/0174934 A1* | 9/2003 | Ishii et al. | .................. 385/18 |
| 2004/0016995 A1 | 1/2004 | Kuo et al. | |
| 2010/0109102 A1 | 5/2010 | Chen et al. | |
| 2011/0265574 A1 | 11/2011 | Yang | |

OTHER PUBLICATIONS

Notice of Allowance for U.S. Appl. No. 12/717,070, mailed on Mar. 9, 2012, 9 pages.
Office Action for U.S. Appl. No. 12/945,087, mailed on Mar. 19, 2012, 6 pages.

* cited by examiner

*Primary Examiner* — Howard Weiss
*Assistant Examiner* — Steven Rao
(74) *Attorney, Agent, or Firm* — Kilpatrick Townsend & Stockton LLP

(57) ABSTRACT

A method and structure for fabricating a monolithic integrated CMOS and MEMS device. The method includes providing a first semiconductor substrate having a first surface region and forming one or more CMOS IC devices on a CMOS IC device region overlying the first surface region. The CMOS IC device region can also have a CMOS surface region. A bonding material can be formed overlying the CMOS surface region to form an interface by which a second semiconductor substrate can be joined to the CMOS surface region. The second semiconductor substrate having a second surface region to the CMOS surface region by bonding the second surface region to the bonding material, the second semiconductor substrate comprising one or more first air dielectric regions. One or more free standing MEMS structures can be formed within one or more portions of the processed first substrate.

28 Claims, 21 Drawing Sheets

INTEGRATED CMOS AND MEMS WITH AIR DIELECTRIC METHOD AND SYSTEM

CROSS-REFERENCES TO RELATED APPLICATIONS

The present application claims priority to and incorporates by reference, for all purposes, the following patent application: U.S. Pat. App. No. 61/296,432, filed Jan. 19, 2010. The present invention also incorporates by reference, for all purposes, the following co-pending patent applications related to CMOS & MEMS devices and IC fabrication methodology: U.S. patent application Ser. No. 12/490,067, filed Jun. 23, 2009, U.S. patent application Ser. No. 12/717,070, filed Mar. 3, 2010, U.S. patent application Ser. No. 12/945,087, filed Nov. 12, 2010, and U.S. patent application Ser. No. 12/945,834, filed Nov. 13, 2010.

BACKGROUND OF THE INVENTION

Embodiments of the present invention relate generally to integrated devices. More particularly, embodiments of the present invention provide a method for fabricating an integrated CMOS and MEMS device using an air dielectric. More specifically, embodiments of the present invention provide a method for bonding one or more semiconductor materials to form one or more air dielectric regions within an integrated CMOS and MEMS device. Merely by way of example, the MEMS devices can include at least an accelerometer, a gyroscope, a magnetic sensor, a pressure sensor, a microphone, a humidity sensor, a temperature sensor, a chemical sensor, a biosensor, an inertial sensor, and others. Additionally, the other applications include at least a sensor application or applications, system applications, and broadband applications, among others. But it will be recognized that embodiments of the invention have a much broader range of applicability.

Research and development in integrated microelectronics have continued to produce astounding progress in CMOS and MEMS. CMOS technology has become the predominant fabrication technology for integrated circuits (IC). MEMS, however, continues to rely upon conventional process technologies. In layman's terms, microelectronic ICs are the "brains" of an integrated device which provides decision-making capabilities, whereas MEMS are the "eyes" and "arms" that provide the ability to sense and control the environment. Some examples of the widespread application of these technologies are the switches in radio frequency (RF) antenna systems, such as those in the iPhone™ device by Apple, Inc. of Cupertino, Calif., and the Blackberry™ phone by Research In Motion Limited of Waterloo, Ontario, Canada, and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC and MEMS has limitless applications through modular measurement devices such as accelerometers, gyroscopes, actuators, and sensors. In conventional vehicles, accelerometers and gyroscopes are used to deploy airbags and trigger dynamic stability control functions, respectively. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, and health care and medical systems. As described previously, ICs and MEMS can be used to practically engage in various type of environmental interaction.

Although highly successful, ICs and in particular MEMS still have limitations. Similar to IC development, MEMS development, which focuses on increasing performance, reducing size, and decreasing cost, continues to be challenging. Additionally, applications of MEMS often require increasingly complex microsystems that desire greater computational power. Unfortunately, such applications generally do not exist. These and other limitations of conventional MEMS and ICs may be further described throughout the present specification and more particularly below.

From the above, it is seen that techniques for improving operation of integrated circuit devices and MEMS are highly desired.

BRIEF SUMMARY OF THE INVENTION

According to the present invention, techniques related generally to integrated devices and systems are provided. More particularly, embodiments of the present invention provide a method for fabricating an integrated CMOS and MEMS device using an air dielectric. More specifically, embodiments of the present invention provide a method for patterning one or more semiconductor layers to form one or more air dielectric regions within an integrated CMOS and MEMS device. Merely by way of example, the MEMS devices can include at least an accelerometer, a gyroscope, a magnetic sensor, a pressure sensor, a microphone, a humidity sensor, a temperature sensor, a chemical sensor, a biosensor, an inertial sensor, and others. Additionally, the other applications include at least a sensor application or applications, system applications, and broadband applications, among others. But it will be recognized that the invention has a much broader range of applicability.

A specific embodiment of the present invention provides a method for fabricating a monolithic integrated CMOS and MEMS device. The method includes providing a first semiconductor substrate having a first surface region and forming one or more CMOS IC devices on a CMOS IC device region overlying the first surface region. The CMOS IC device region can also have a CMOS surface region. A bonding material can be formed overlying the CMOS surface region to form an interface by which a second semiconductor substrate can be joined to the CMOS surface region. The second semiconductor substrate having a second surface region to the CMOS surface region by bonding the second surface region to the bonding material, the second semiconductor substrate comprising one or more first air dielectric regions. One or more free standing MEMS structures can be formed within one or more portions of the processed first substrate.

Embodiments of the present invention can provide many benefits over conventional techniques. For example, the present technique provides an easy to use process that relies upon conventional technology. In some embodiments, the method provides higher device yields in dies per wafer with the integrated approach. Additionally, the method provides a process and system that are compatible with conventional process technology without substantial modifications to conventional equipment and processes. In a specific embodiment, the air dielectric regions can reduce metal line coupling, capacitance, signal interference, and other related issues. Also, these regions can reduce parasitic coupling to the substrate, reduce signal loss, and reduce power while increasing bandwidth. These benefits, as well as others, can be used to achieve higher performance (i.e. less reflection and lower power) in antennas and lower loss and higher isolation in transmission lines. Preferably, embodiments of the invention provide for an improved MEMS device system and related applications for a variety of uses. One or more embodiments of the present invention provide for all MEMS and related applications, which may be integrated on one or more CMOS device structures. Depending upon the embodiment, one or more of these benefits may be achieved. These and other benefits will be described in more throughout the present specification and more particularly below.

Various additional embodiments, features, and advantages of the present invention can be more fully appreciated with reference to the detailed description and accompanying drawings that follow.

DETAILED DESCRIPTION OF THE INVENTION

According to the present invention, techniques related generally to integrated devices and systems are provided. More particularly, the present invention provides a method for fabricating an integrated CMOS and MEMS device using an air dielectric. More specifically, the present invention provides a method for bonding semiconductor materials to form one or more air dielectric regions within an integrated CMOS and MEMS device. Merely by way of example, the MEMS devices can include at least an accelerometer, a gyroscope, a magnetic sensor, a pressure sensor, a microphone, a humidity sensor, a temperature sensor, a chemical sensor, a biosensor, an inertial sensor, and others. Additionally, the other applications include at least a sensor application or applications, system applications, and broadband applications, among others. But it will be recognized that the invention has a much broader range of applicability.

Figure 1A:
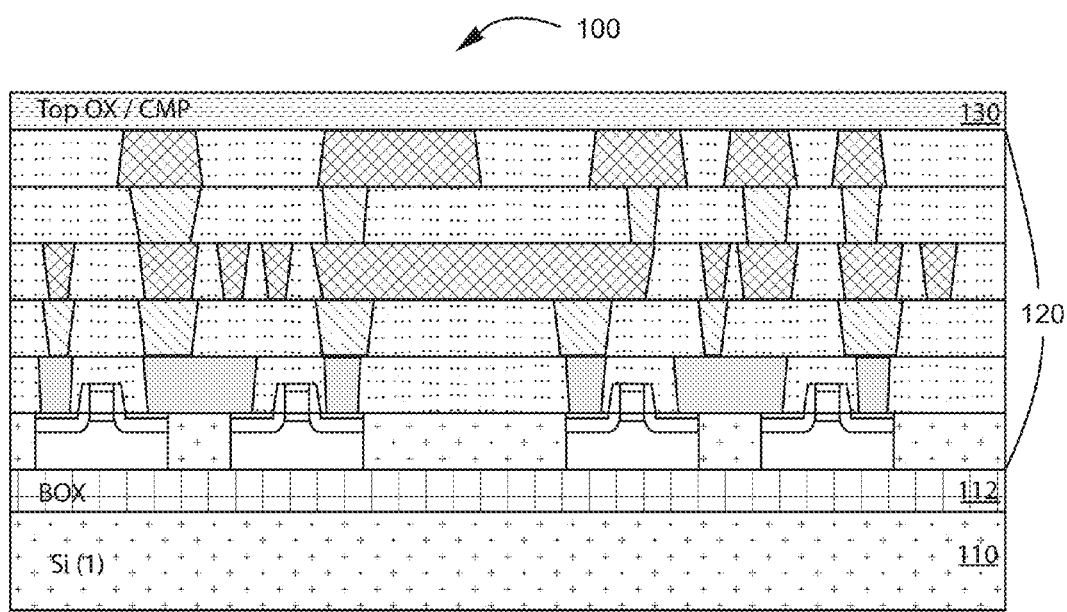
FIG. 1A is a simplified cross-section diagram of an integrated CMOS and MEMS device according to an embodiment of the present invention.
Figure 1B:
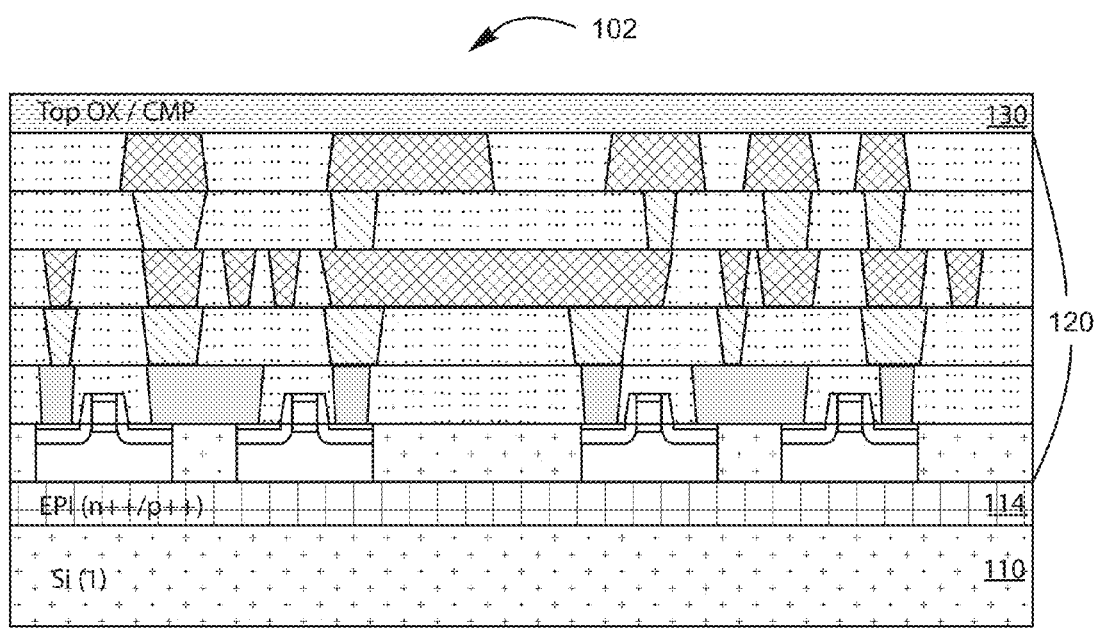
FIG. 1B is a simplified cross-section diagram of an integrated CMOS and MEMS device according to an embodiment of the present invention.
Figure 1C:
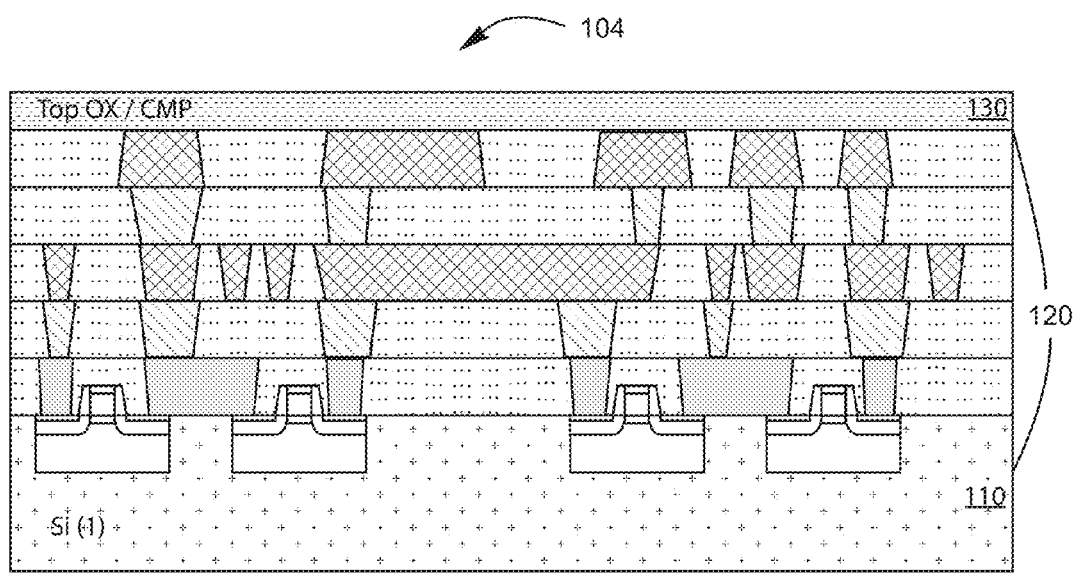
FIG. 1C is a simplified cross-section diagram of an integrated CMOS and MEMS device according to an embodiment of the present invention.

FIGS. 1A-1C are simplified cross-section diagrams of an integrated CMOS and MEMS device according to an embodiment of the present invention. These diagrams are merely an example, which should not unduly limit the scope of the claims herein. One of ordinary skill in the art would recognize other variations, modifications, and alternatives. As shown, each of devices 100, 102, and 104 includes a thickness of silicon material 110, one or more CMOS integrated circuit (IC) devices 120, and a dielectric layer 130. Components shown in these figures can represent an initial phase for a method of fabricating an integrated CMOS and MEMS device using air dielectrics. Those of ordinary skill in the art will recognize other variations, modifications, and alternatives.

In an embodiment, a layer of material can be spatially disposed overlying a thickness of silicon material 110 to form a first semiconductor substrate. In a specific embodiment, the layer of material disposed overlying thickness of silicon material 110 can be a buried oxide (BOX) layer 112, as shown in device 100 of FIG. 1A. In another specific embodiment, the layer of material disposed overlying thickness of silicon material 110 can be an epitaxial (EPI) layer 114, as shown in device 102 of FIG. 1B. In yet another specific embodiment, the first semiconductor substrate can have just thickness of silicon material 110, as shown in device 104 of FIG. 1C. In further embodiments, the first semiconductor substrate can have a silicon, single crystal silicon, or polycrystalline silicon material. Those skilled in the art will recognize other variations, modifications, and alternatives.

In an embodiment, the first semiconductor substrate can have a first surface region and the CMOS device region can be a region overlying the first surface region. One or more CMOS IC devices 120 can be spatially disposed on the CMOS IC device region overlying the first surface region. The CMOS IC device region can have a CMOS surface region. In a specific embodiment, one or more CMOS IC devices 120 can include transistor devices, metal layers, via structures, and others. In further embodiments, additional transistors, metal layers, and structures can be added. The fabrication of one or more CMOS IC device 120 can be done through foundry-compatible processes. Of course, there can be other variations, modifications, and alternatives.

In an embodiment, dielectric layer 130 can be spatially disposed overlying the CMOS surface region. Dielectric layer 130 can have one or more patterned regions. In a specific embodiment, dielectric layer 130 can be a top oxide layer or formed via a chemical mechanical planarization (CMP) process. As stated previously, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 2A:
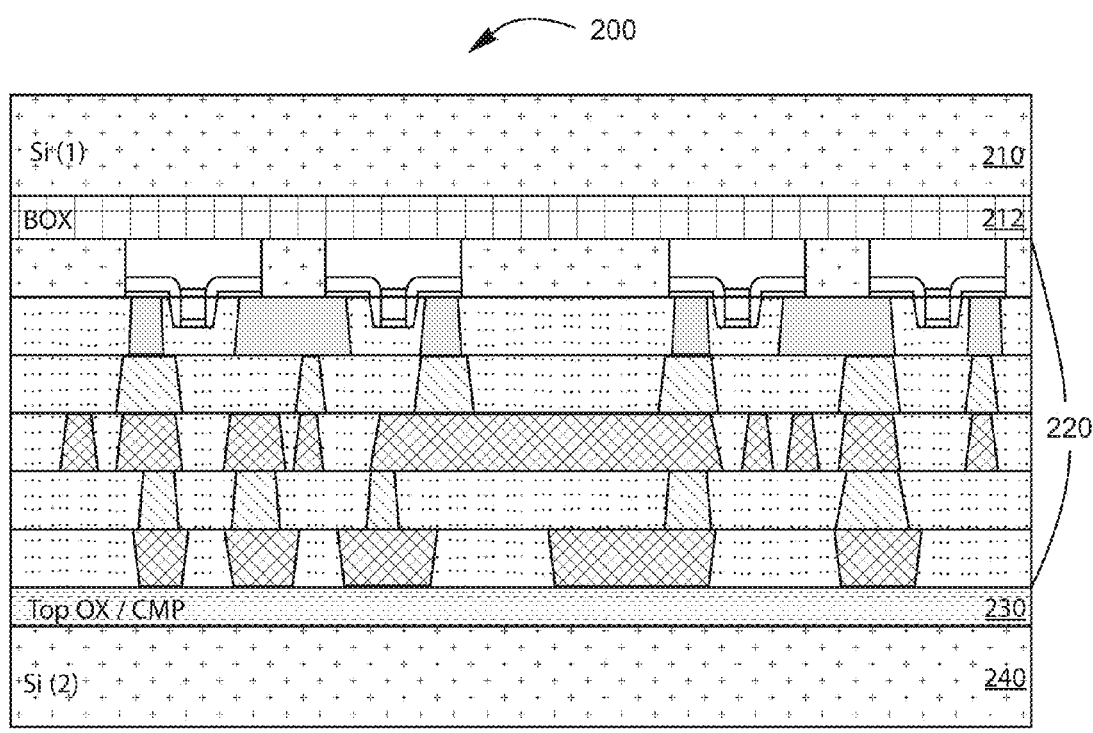
FIG. 2A is a simplified cross-section diagram of an integrated CMOS and MEMS device according to an embodiment of the present invention.
Figure 2B:
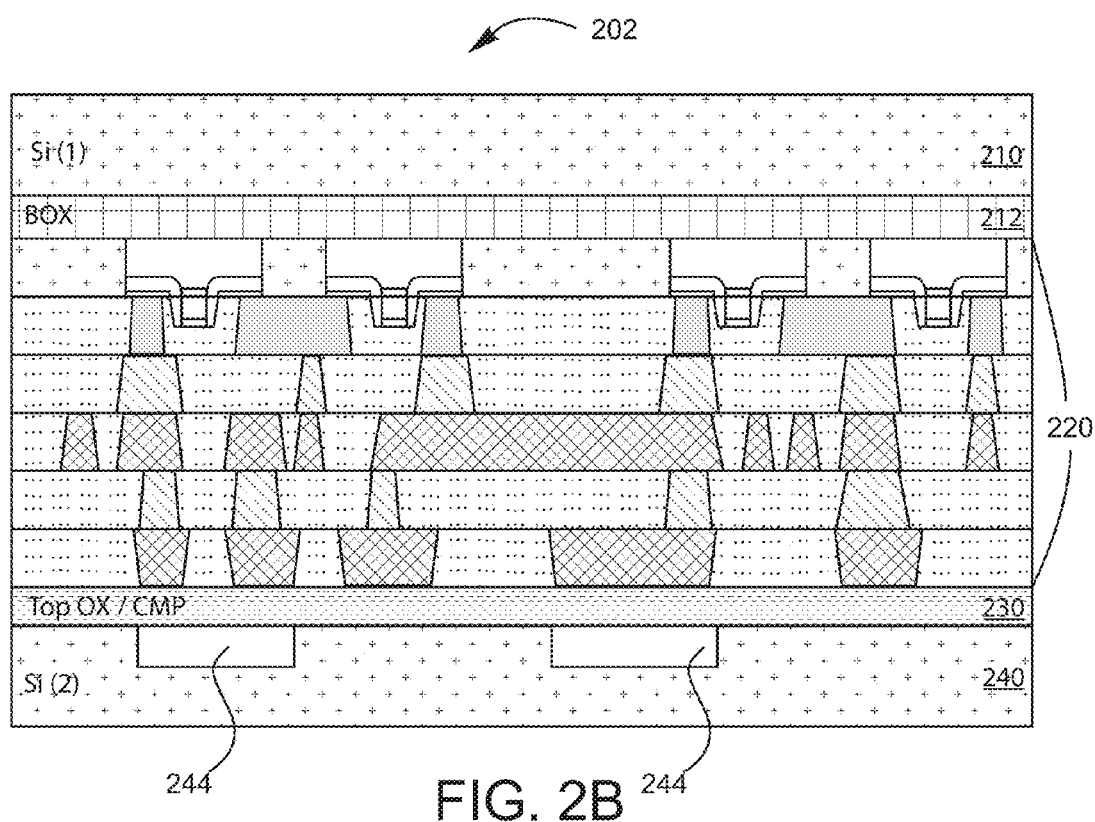
FIG. 2B is a simplified cross-section diagram of an integrated CMOS and MEMS device according to an embodiment of the present invention.

FIGS. 2A and 2B are simplified cross-section diagrams of an integrated CMOS and MEMS device according to an embodiment of the present invention. This diagram is merely an example, which should not unduly limit the scope of the claims herein. One of ordinary skill in the art would recognize other variations, modifications, and alternatives. As shown, each of devices 200 and 202 includes a thickness of silicon material 210, one or more CMOS integrated circuit (IC) devices 220, and a dielectric layer 230, and a second semiconductor substrate 240. Components shown in these figures can represent a step in a method of fabricating an integrated CMOS and MEMS device using air dielectrics. Those of ordinary skill in the art will recognize other variations, modifications, and alternatives.

In an embodiment, a layer of material can be spatially disposed overlying thickness of silicon material 210 to form a first semiconductor substrate. In a specific embodiment, the layer of material disposed overlying thickness of silicon material 210 can be a buried oxide (BOX) layer 212, as shown in device 200 of FIG. 2A. In another specific embodiment, the layer of material disposed overlying thickness of silicon material 210 can be an epitaxial (EPI) layer or the first semiconductor substrate can have just thickness of silicon material 210. In further embodiments, the first and second semiconductor substrate can have a silicon, single crystal silicon, or polycrystalline silicon material. Those skilled in the art will recognize other variations, modifications, and alternatives.

In an embodiment, the first semiconductor substrate can have a first surface region and the CMOS device region can be a region overlying the first surface region. One or more CMOS IC devices 220 can be spatially disposed on the CMOS IC device region overlying the first surface region. The CMOS IC device region can have a CMOS surface region. In a specific embodiment, one or more CMOS IC devices 220 can include transistor devices, metal layers, via structures, and others. In further embodiments, additional transistors, metal layers, and structures can be added. The fabrication of one or more CMOS IC device 220 can be done through foundry-compatible processes. Of course, there can be other variations, modifications, and alternatives.

In an embodiment, dielectric layer 230 can be spatially disposed overlying the CMOS surface region. Dielectric layer 230 can have one or more patterned regions. In a specific embodiment, dielectric layer 230 can be a top oxide layer or formed via a chemical mechanical planarization (CMP) process. As stated previously, there can be other variations, modifications, and alternatives.

In an embodiment, second semiconductor substrate 240 can be joined to the CMOS surface region by bonding the second surface region to dielectric layer 230, as shown in device 200 of FIG. 2A. The second semiconductor substrate can have a second surface region. Also, the second semiconductor substrate can be patterned such that one or more portions of the second substrate within a vicinity of one or more CMOS IC devices 220 are removed in order to form one or more first air dielectric regions 244, as shown in device 202 of FIG. 2B. In a specific embodiment, the second substrate can be patterned before bonding. Air dielectric regions 244 can reduce metal line coupling, capacitance, signal interference, and other related issues. In a specific embodiment, regions 244 can also reduce parasitic coupling to the substrate, reduce signal loss, and reduce power while increasing bandwidth. These benefits, as well as others, can be used to achieve higher performance (i.e. less reflection and lower power) in antennas and lower loss and higher isolation in transmission lines. Again, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 3:
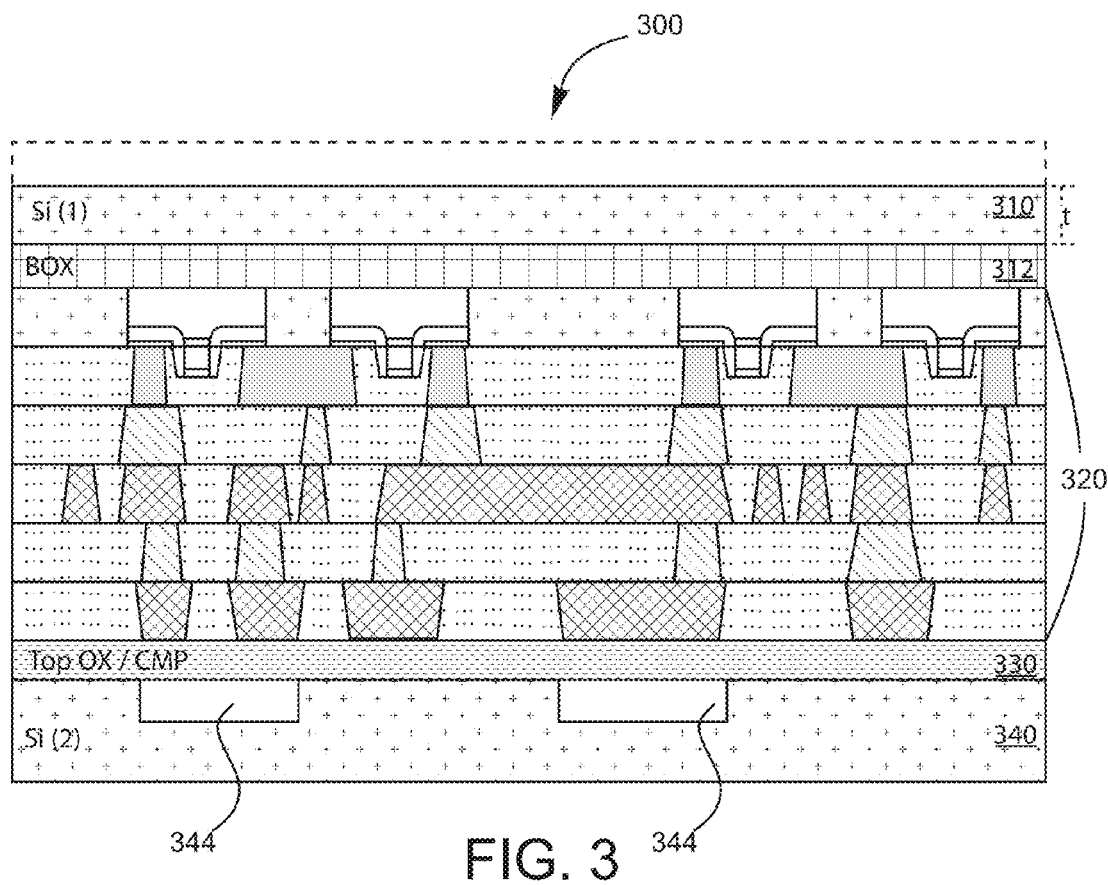
FIG. 3 is a simplified cross-section diagram of an integrated CMOS and MEMS device according to an embodiment of the present invention.

FIG. 3 is a simplified cross-section diagram of an integrated CMOS and MEMS device according to an embodiment of the present invention. This diagram is merely an example, which should not unduly limit the scope of the claims herein. One of ordinary skill in the art would recognize other variations, modifications, and alternatives. As shown, device 300 includes a thickness of silicon material 310, one or more CMOS integrated circuit (IC) devices 320, and a dielectric layer 330, and a second semiconductor substrate 340. Components shown in these figures can represent a step in a method of fabricating an integrated CMOS and MEMS device using air dielectrics. Those of ordinary skill in the art will recognize other variations, modifications, and alternatives.

In an embodiment, a layer of material can be spatially disposed overlying thickness of silicon material 310 to form a first semiconductor substrate. In a specific embodiment, the layer of material disposed overlying thickness of silicon material 310 can be a buried oxide (BOX) layer 312. In another specific embodiment, the layer of material disposed overlying thickness of silicon material 310 can be an epitaxial (EPI) layer or the first semiconductor substrate can have just thickness of silicon material 310. In further embodiments, the first and second semiconductor substrate can have a silicon, single crystal silicon, or polycrystalline silicon material. Those skilled in the art will recognize other variations, modifications, and alternatives.

In an embodiment, the first semiconductor substrate can have a first surface region and the CMOS device region can be a region overlying the first surface region. One or more CMOS IC devices 320 can be spatially disposed on the CMOS IC device region overlying the first surface region. The CMOS IC device region can have a CMOS surface region. In a specific embodiment, one or more CMOS IC devices 320 can include transistor devices, metal layers, via structures, and others. In further embodiments, additional transistors, metal layers, and structures can be added. The fabrication of one or more CMOS IC device 320 can be done through foundry-compatible processes. Of course, there can be other variations, modifications, and alternatives.

In an embodiment, dielectric layer 330 can be spatially disposed overlying the CMOS surface region. Dielectric layer 330 can have one or more patterned regions. In a specific embodiment, dielectric layer 330 can be a top oxide layer or formed via a chemical mechanical planarization (CMP) process. As stated previously, there can be other variations, modifications, and alternatives.

In an embodiment, second semiconductor substrate 340 can be joined to the CMOS surface region by bonding the second surface region to dielectric layer 330. The second semiconductor substrate can have a second surface region. Also, the second semiconductor substrate can be patterned such that one or more portions of the second substrate within a vicinity of one or more CMOS IC devices 320 are removed in order to form one or more first air dielectric regions 344. In a specific embodiment, the second substrate can be patterned before bonding. Air dielectric regions 344 can reduce metal line coupling, capacitance, signal interference, and other related issues. In a specific embodiment, regions 344 can also reduce parasitic coupling to the substrate, reduce signal loss, and reduce power while increasing bandwidth. These benefits, as well as others, can be used to achieve higher performance (i.e. less reflection and lower power) in antennas and lower loss and higher isolation in transmission lines. Again, there can be other variations, modifications, and alternatives.

In an embodiment, the first substrate can be thinned to a desired thickness while maintaining attachment to the CMOS IC device region. In a specific embodiment, the thinning can include a grinding process to remove a thickness of material from the first semiconductor substrate to expose a ground surface region. This process can be done by removing a portion of thickness of silicon material 310 without removing any portion the BOX layer. In other embodiments, this process can be done by removing a portion of thickness of silicon material 310 without removing any portion of the EPI layer or without removing material from the CMOS IC device region. Again, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 4A:
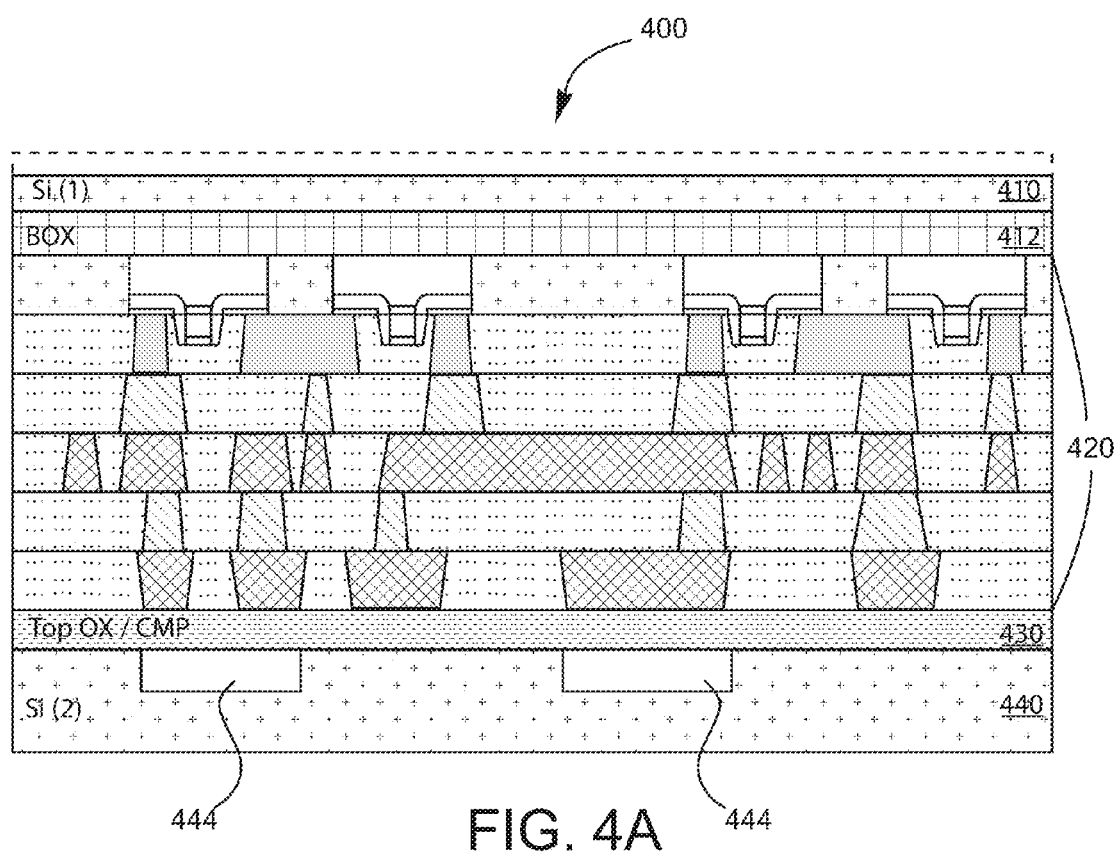
FIG. 4A is a simplified cross-section diagram of an integrated CMOS and MEMS device according to an embodiment of the present invention.
Figure 4B:
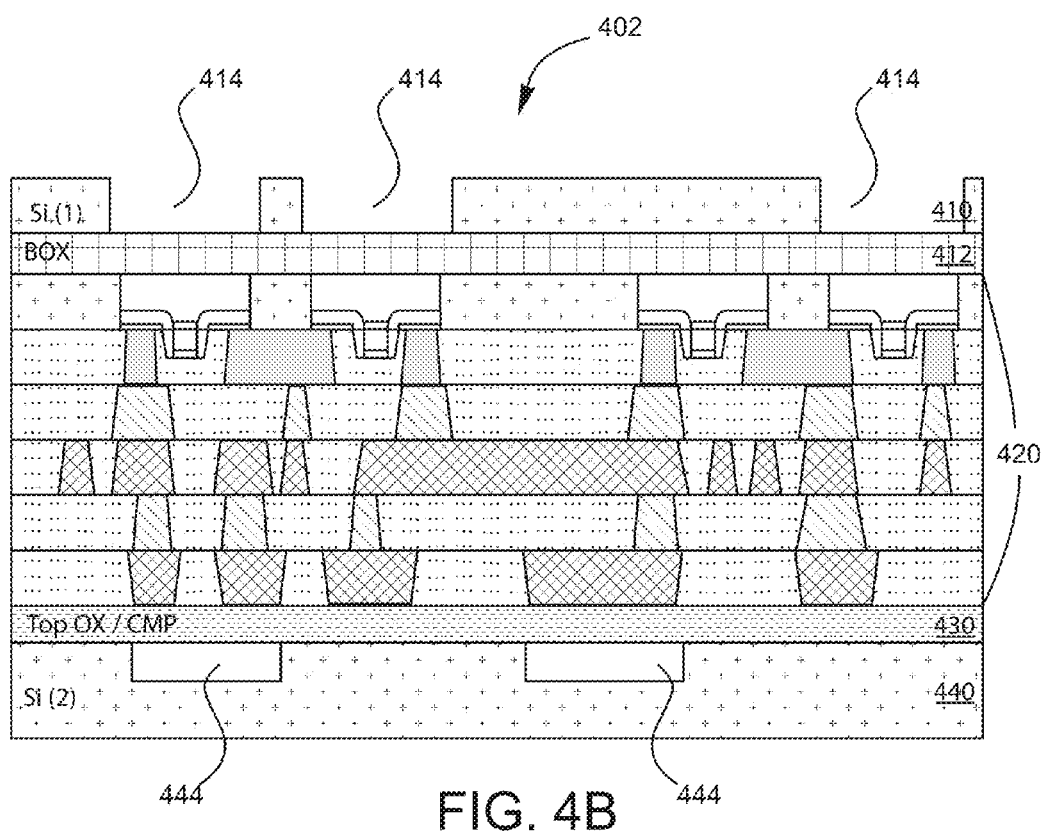
FIG. 4B is a simplified cross-section diagram of an integrated CMOS and MEMS device according to an embodiment of the present invention.
Figure 4C:
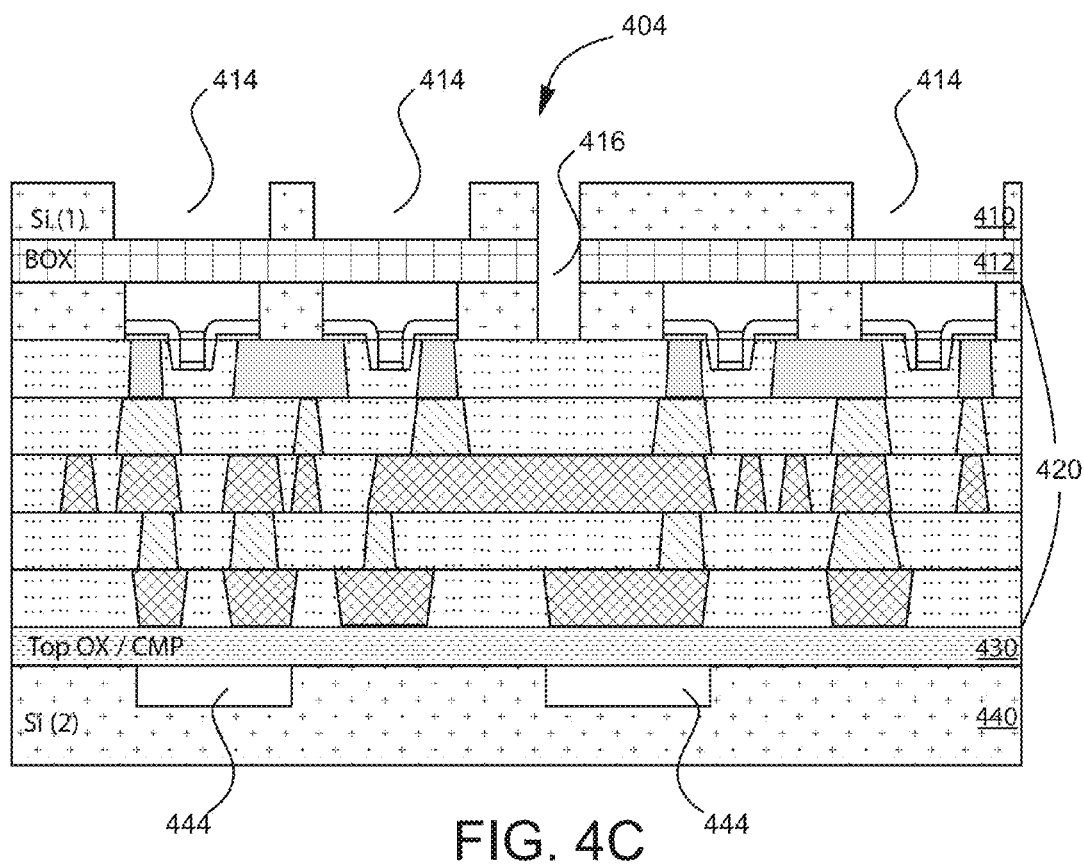
FIG. 4C is a simplified cross-section diagram of an integrated CMOS and MEMS device according to an embodiment of the present invention.

FIGS. 4A-4C are simplified cross-section diagrams of an integrated CMOS and MEMS device according to an embodiment of the present invention. This diagram is merely an example, which should not unduly limit the scope of the claims herein. One of ordinary skill in the art would recognize other variations, modifications, and alternatives. As shown, each of devices 400, 402, and 404 includes a thickness of silicon material 410, one or more CMOS integrated circuit (IC) devices 420, and a dielectric layer 430, and a second semiconductor substrate 440. Components shown in these figures can represent a step in a method of fabricating an integrated CMOS and MEMS device using air dielectrics. Those of ordinary skill in the art will recognize other variations, modifications, and alternatives.

In an embodiment, a layer of material can be spatially disposed overlying thickness of silicon material 410 to form a first semiconductor substrate. In a specific embodiment, the layer of material disposed overlying the thickness of silicon material 410 can be a buried oxide (BOX) layer 412. In another specific embodiment, the layer of material disposed overlying thickness of silicon material 410 can be an epitaxial (EPI) layer or the first semiconductor substrate can have just thickness of silicon material 410. In further embodiments, the first and second semiconductor substrate can have a silicon, single crystal silicon, or polycrystalline silicon material. Those skilled in the art will recognize other variations, modifications, and alternatives.

In an embodiment, the first semiconductor substrate can have a first surface region and the CMOS device region can be a region overlying the first surface region. One or more CMOS IC devices 420 can be spatially disposed on the CMOS IC device region overlying the first surface region. The CMOS IC device region can have a CMOS surface region. In a specific embodiment, one or more CMOS IC devices 420 can include transistor devices, metal layers, via structures, and others. In further embodiments, additional transistors, metal layers, and structures can be added. The fabrication of one or more CMOS IC device 420 can be done through foundry-compatible processes. Of course, there can be other variations, modifications, and alternatives.

In an embodiment, dielectric layer 430 can be spatially disposed overlying the CMOS surface region. Dielectric layer 430 can have one or more patterned regions. In a specific embodiment, dielectric layer 430 can be a top oxide layer or formed via a chemical mechanical planarization (CMP) process. As stated previously, there can be other variations, modifications, and alternatives.

In an embodiment, second semiconductor substrate 440 can be joined to the CMOS surface region by bonding the second surface region to dielectric layer 430. The second semiconductor substrate can have a second surface region. Also, the second semiconductor substrate can be patterned such that one or more portions of the second substrate within a vicinity of one or more CMOS IC devices 420 are removed in order to form one or more first air dielectric regions 444. In a specific embodiment, the second substrate can be patterned before bonding. Air dielectric regions 444 can reduce metal line coupling, capacitance, signal interference, and other related issues. In a specific embodiment, regions 444 can also reduce parasitic coupling to the substrate, reduce signal loss, and reduce power while increasing bandwidth. These benefits, as well as others, can be used to achieve higher performance (i.e. less reflection and lower power) in antennas and lower loss and higher isolation in transmission lines. Again, there can be other variations, modifications, and alternatives.

In an embodiment, the first substrate can be thinned to a desired thickness while maintaining attachment to the CMOS IC device region. In a specific embodiment, the thinning can include a grinding process to remove a thickness of material from the first semiconductor substrate to expose a ground surface region. This process can be done by removing a portion of thickness of silicon material 410 without removing any portion the BOX layer. In other embodiments, this process can be done by removing a portion of thickness of silicon material 310 without removing any portion of the EPI layer or without removing material from the CMOS IC device region.

In a specific embodiment, the thinning can include subjecting the ground surface region to a polishing process to smooth the ground surface region to a predetermined surface roughness, as shown in FIG. 4A. During either or both the grinding process and/or the polishing process, the thickness of the first substrate can be monitored. In a specific embodiment, the monitoring includes using an interferometer process to measure an indication associated with the thickness of the first semiconductor substrate. The interferometer process can use an electromagnetic radiation in an infrared wavelength range. In a specific embodiment, the polishing process can include a blanket etching process, as shown in FIG. 4A.

Also, the thinning can include cleaving a portion of the first semiconductor substrate at a cleave region to remove the desired thickness from the first substrate. The cleave region can be within a vicinity of the desired thickness, which is a remaining portion of the first substrate that is still attached to the CMOS IC device region. In another specific embodiment, the first substrate can be an SOI substrate including a bulk portion, overlying insulating layer, and single crystal device layer. The thinning can include selectively removing a portion of the SOI substrate from the single crystal device layer while maintaining attachment to the CMOS IC device region. In another specific embodiment, the thinning can include a patterned etching process such that one or more portions of the first semiconductor substrate within a vicinity of one or more CMOS IC devices are removed to form one or more second air dielectric regions 414, as shown in FIG. 4B. In a specific embodiment, the first substrate can be patterned before bonding. Air dielectric regions 414 can reduce metal line coupling, capacitance, signal interference, and other related issues. In a specific embodiment, regions 414 can also reduce parasitic coupling to the substrate, reduce signal loss, and reduce power while increasing bandwidth. These benefits, as well as others, can be used to achieve higher performance (i.e. less reflection and lower power) in antennas and lower loss and higher isolation in transmission lines. These benefits, as well as others, can be used to achieve higher performance (i.e. less reflection and lower power) in antennas and lower loss and higher isolation in transmission lines. Again, there can be other variations, modifications, and alternatives.

In an embodiment, one or more via structures can be formed within one or more portions of the desired thickness of the first semiconductor substrate. In a specific embodiment, one or more via structures can extend from one or more portions of the CMOS IC device region to a vicinity of the desired thickness of the first substrate. The one or more via structures 416 can be configured as one or more stop structures to form one or more end point regions of the thinning. Additionally, a conformal coating of metal material can be formed within the one or more via structures. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 5A:
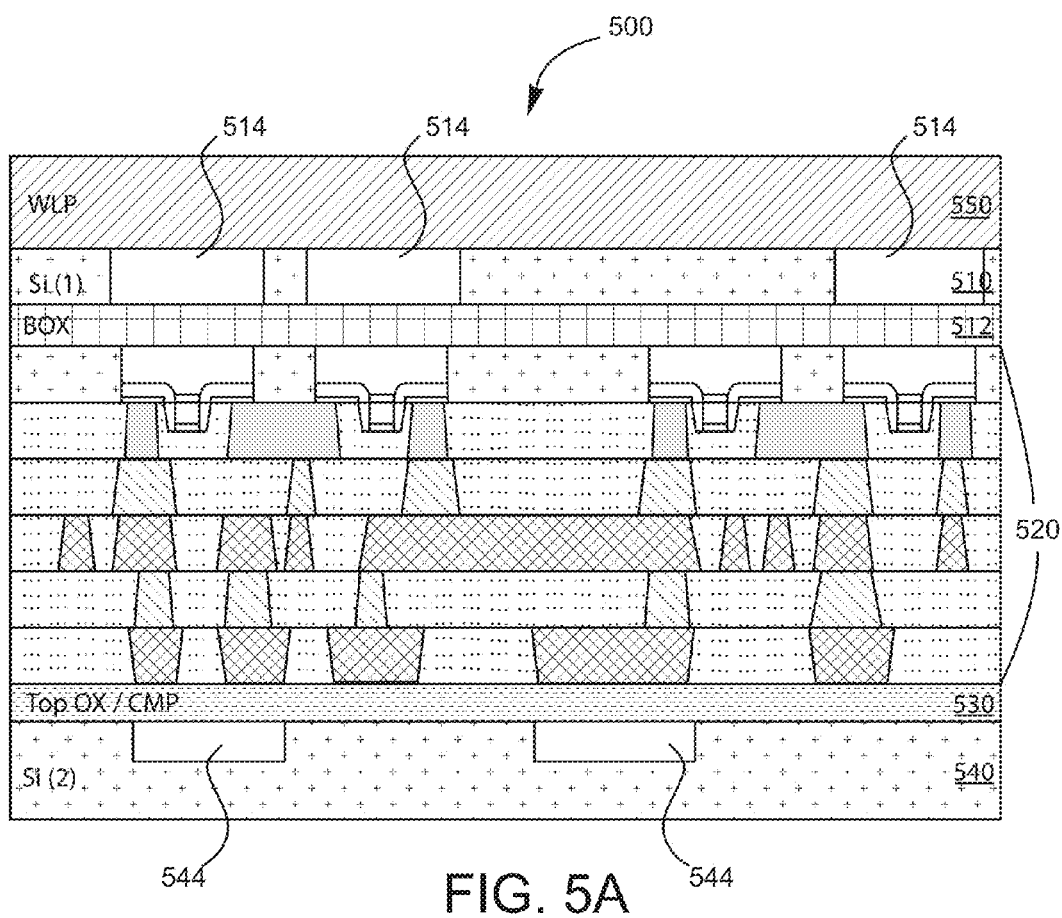
FIG. 5A is a simplified cross-section diagram of an integrated CMOS and MEMS device according to an embodiment of the present invention.
Figure 5B:
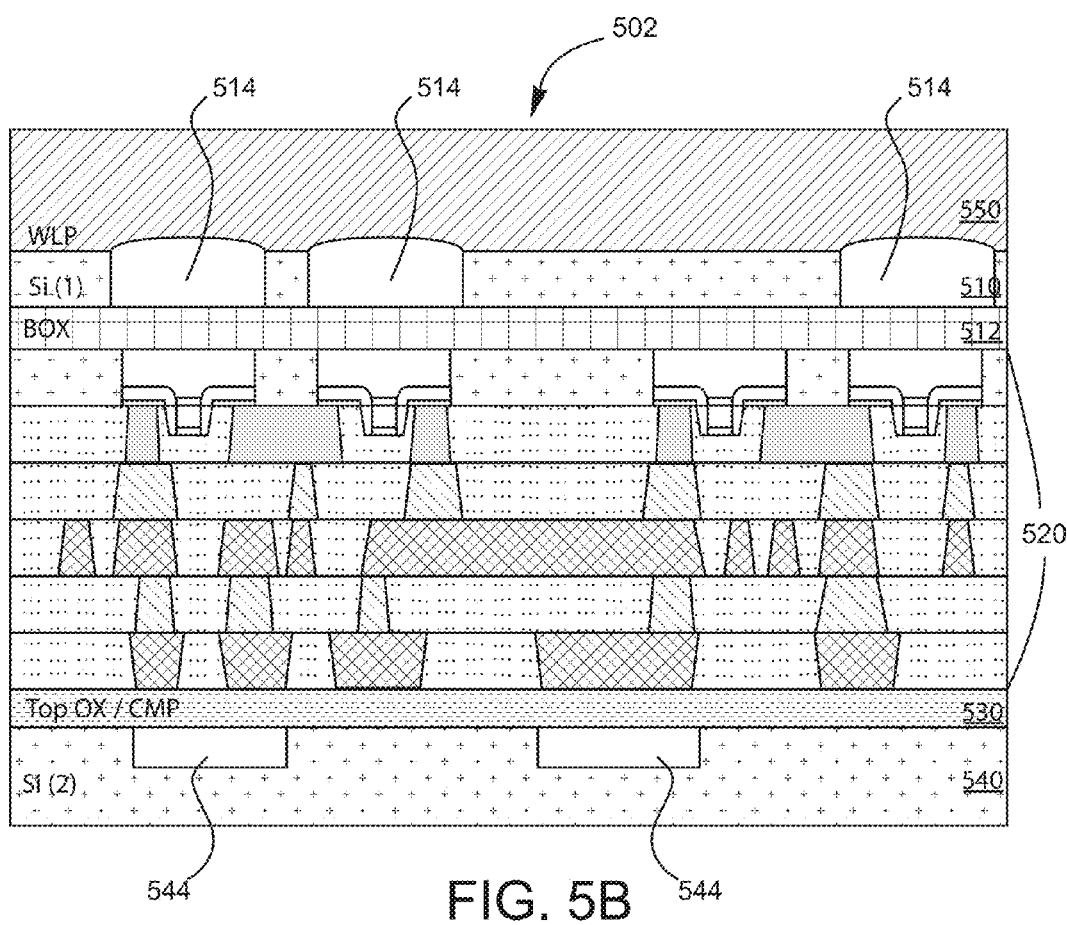
FIG. 5B is a simplified cross-section diagram of an integrated CMOS and MEMS device according to an embodiment of the present invention.
Figure 5C:
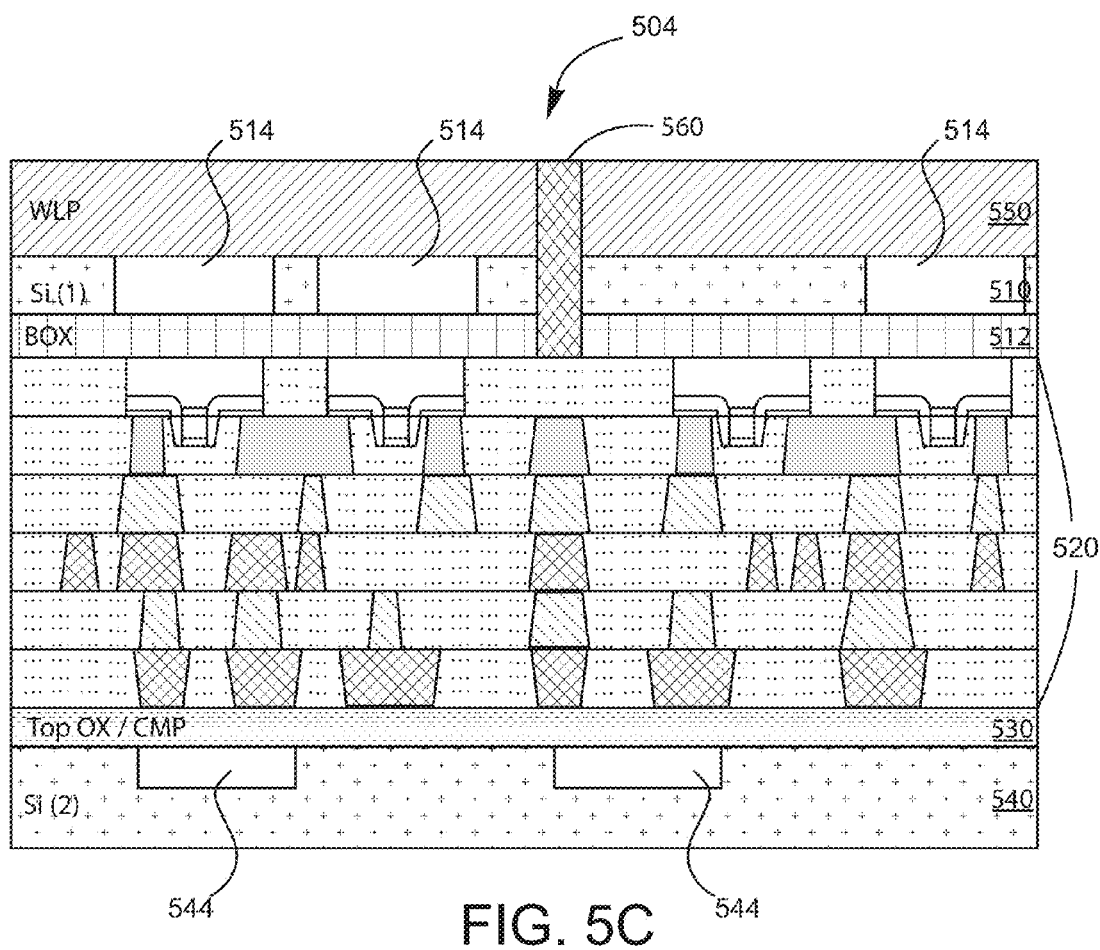
FIG. 5C is a simplified cross-section diagram of an integrated CMOS and MEMS device according to an embodiment of the present invention.

FIGS. 5A-5C are simplified cross-section diagrams of an integrated CMOS and MEMS device according to an embodiment of the present invention. This diagram is merely an example, which should not unduly limit the scope of the claims herein. One of ordinary skill in the art would recognize other variations, modifications, and alternatives. As shown, each of devices 500, 502, and 504 includes a thickness of silicon material 510, one or more CMOS integrated circuit (IC) devices 520, and a dielectric layer 530, a second semiconductor substrate 540, and an encapsulation layer 550. Components shown in these figures can represent a step in a method of fabricating an integrated CMOS and MEMS device using air dielectrics. Those of ordinary skill in the art will recognize other variations, modifications, and alternatives.

In an embodiment, thickness of silicon material 510 can be operably coupled to a BOX layer 512 to form a first semiconductor substrate. There can be different semiconductor substrate compositions and patterned etching processes can be applied to create one or more first air dielectric regions 514 within one or more portions of the first substrate and one or more second air dielectric regions 544 within one or more portions of the second substrate. Other variations, modifications, and alternatives regarding the first and second semiconductor substrate, the CMOS IC devices, dielectric layers and thinning processes have been discussed in the previous figures.

In an embodiment, encapsulation layer 550 can be spatially disposed overlying the first semiconductor substrate, which is shown in FIG. 5A overlying the CMOS IC devices 520, dielectric layer 530, and second semiconductor substrate 540. In a specific embodiment, encapsulation layer 550 can include a WLP layer, which can include a layer of material bonded to the first substrate. In another specific embodiment, the WLP layer can be a thin film of material deposited overlying the first substrate, as shown in FIG. 5B. Those skilled in the art will recognize other variations, modifications, and alternatives.

In an embodiment, one or more via structures 560 can be formed within one or more portions of the desired thickness of the first semiconductor substrate. In a specific embodiment, one or more via structures can extend from one or more portions of the CMOS IC device region to a vicinity of the desired thickness of the first substrate. One or more via structures 560 can be configured as one or more stop structures to form one or more end point regions of the thinning. Additionally, a conformal coating of metal material can be formed within the one or more via structures 560. Via structures 560 can also extend through encapsulation layer 550. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

FIGS. 6A-6D are simplified cross-section diagrams of an integrated CMOS and MEMS device according to an embodiment of the present invention. This diagram is merely an example, which should not unduly limit the scope of the claims herein. One of ordinary skill in the art would recognize other variations, modifications, and alternatives. As shown, each of devices 600, 602, 604, and 606 includes a thickness of silicon material 610, one or more CMOS integrated circuit (IC) devices 620, and a dielectric layer 630, a second semiconductor substrate 640, an encapsulation layer 650, and one or more bonding structures. Components shown in these figures can represent a step in a method of fabricating an integrated CMOS and MEMS device using air dielectrics. Those of ordinary skill in the art will recognize other variations, modifications, and alternatives.

In an embodiment, thickness of silicon material 610 can be operably coupled to a BOX layer 612 to form a first semiconductor substrate. There can be different semiconductor substrate compositions and patterned etching processes can be applied to create one or more first air dielectric regions 614 within one or more portions of the first substrate and one or more second air dielectric regions 644 within one or more portions of the second substrate. Several types of WLP layers, such as wafer and thin film, can be applied depending on the type of application. Other variations, modifications, and alternatives regarding the first and second semiconductor substrate, the CMOS IC devices, dielectric layers and thinning processes have been discussed in the previous figures.

Figure 6A:
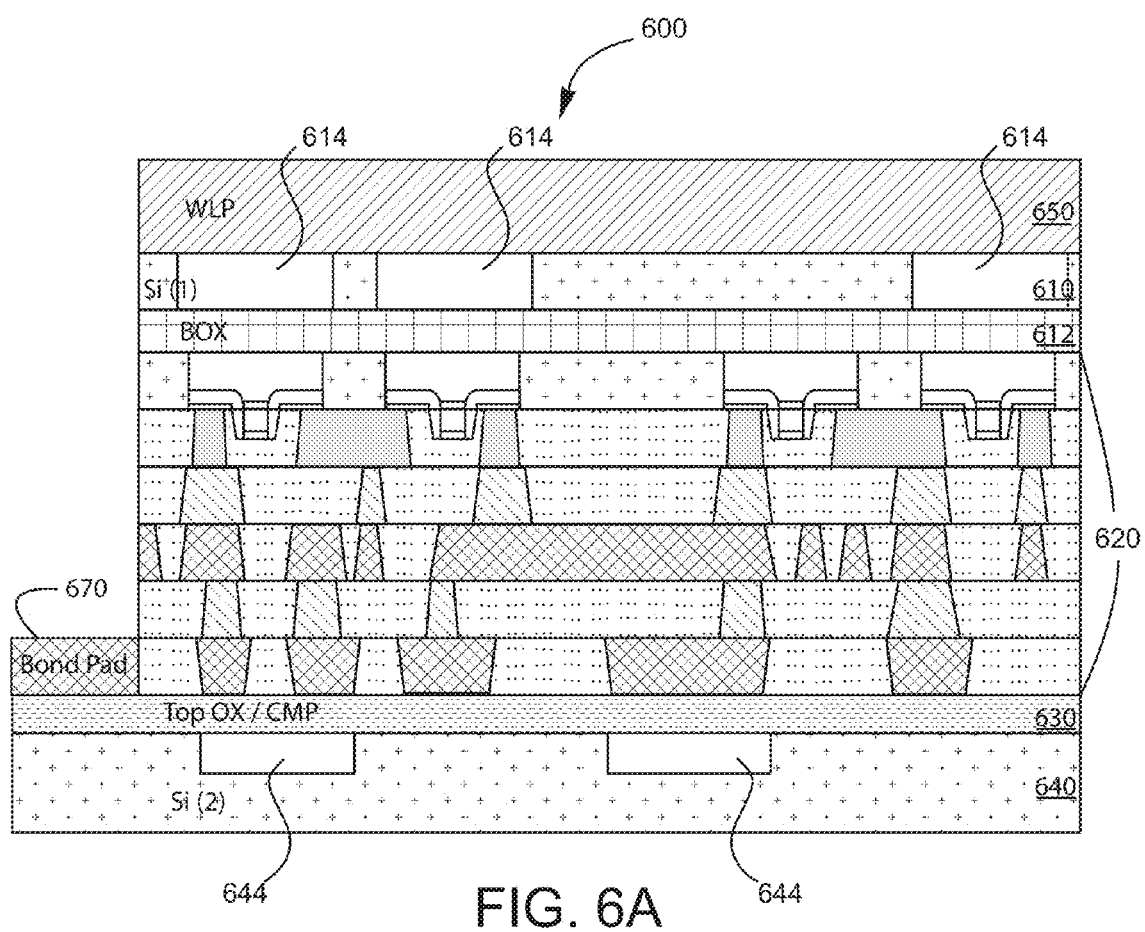
FIG. 6A is a simplified cross-section diagram of an integrated CMOS and MEMS device according to an embodiment of the present invention.
Figure 6B:
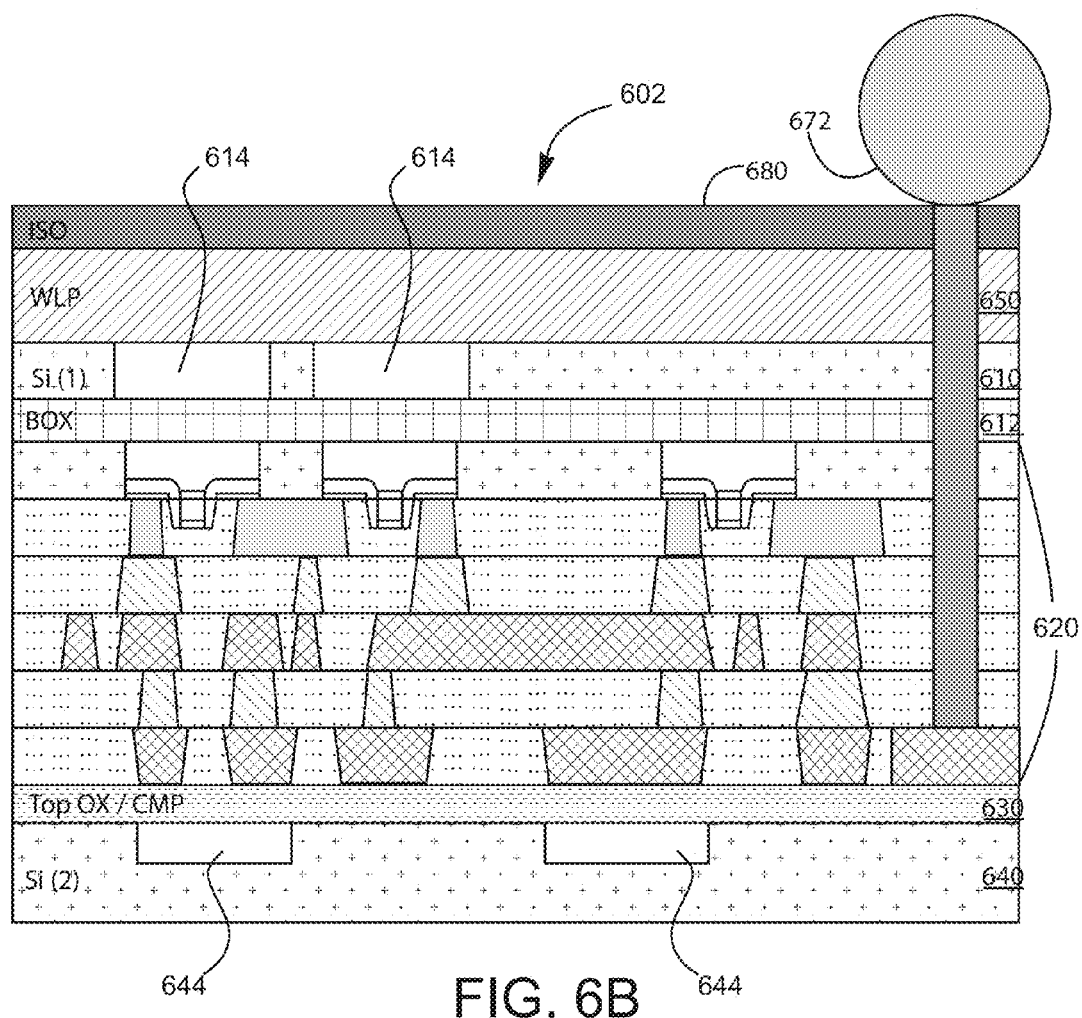
FIG. 6B is a simplified cross-section diagram of an integrated CMOS and MEMS device according to an embodiment of the present invention.
Figure 6C:
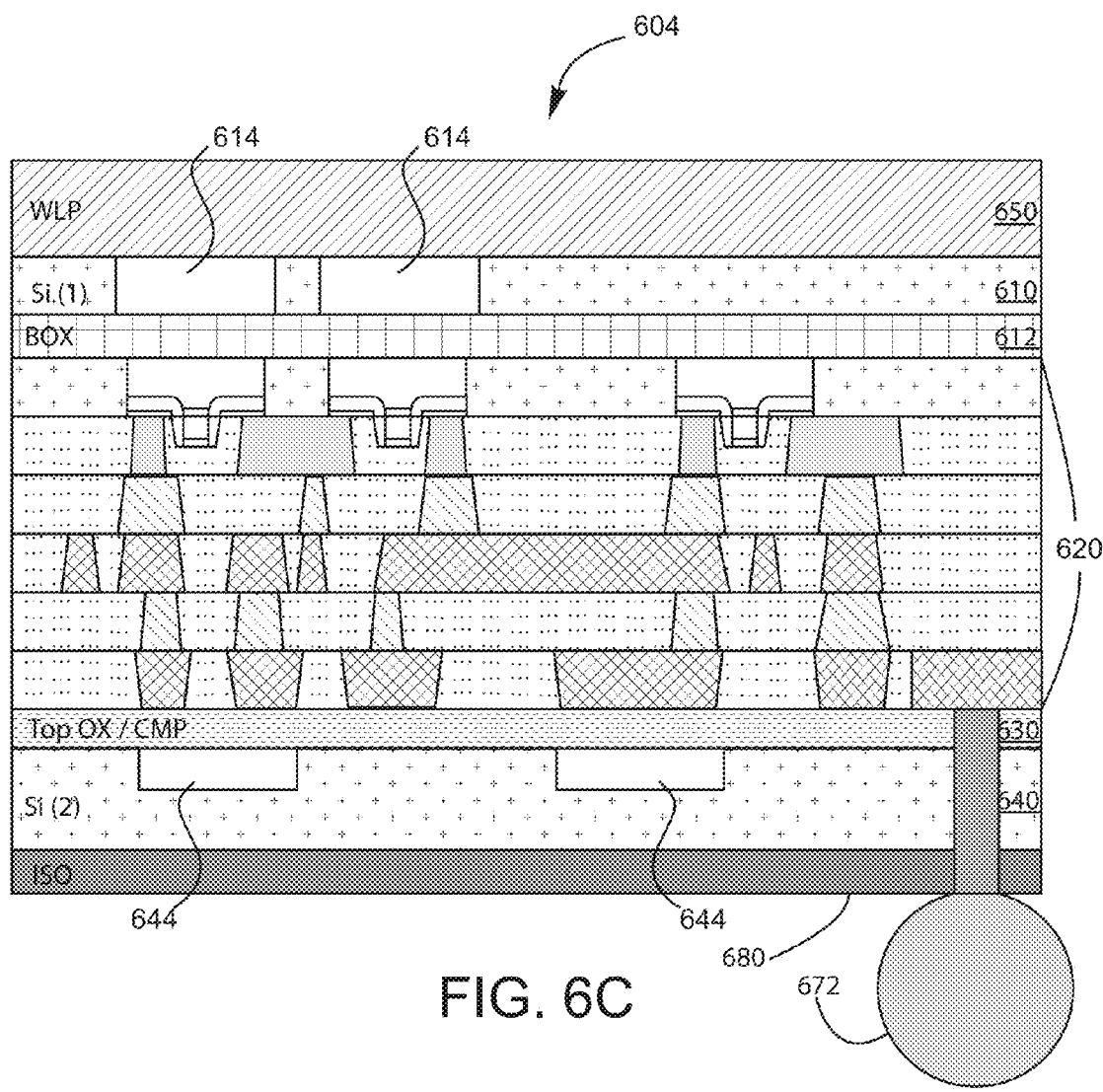
FIG. 6C is a simplified cross-section diagram of an integrated CMOS and MEMS device according to an embodiment of the present invention.
Figure 6D:
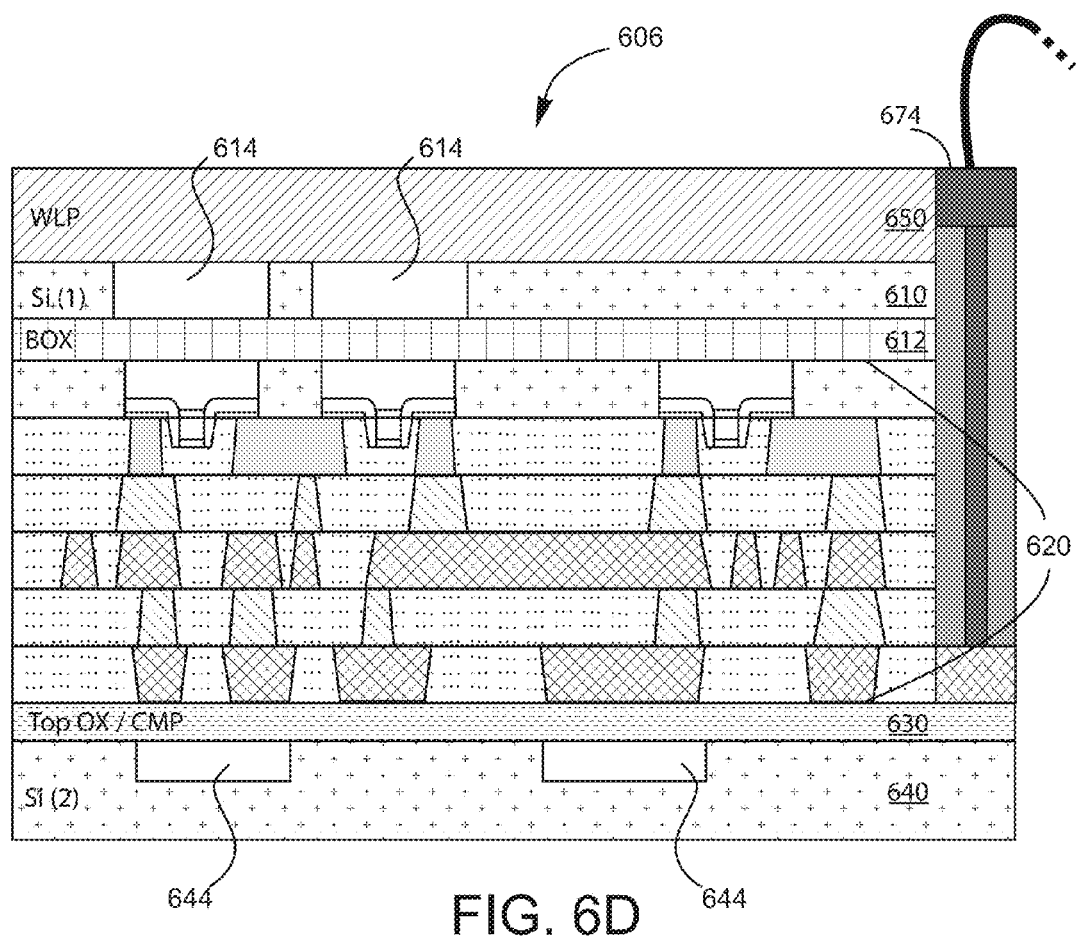
FIG. 6D is a simplified cross-section diagram of an integrated CMOS and MEMS device according to an embodiment of the present invention.
Figure 7A:
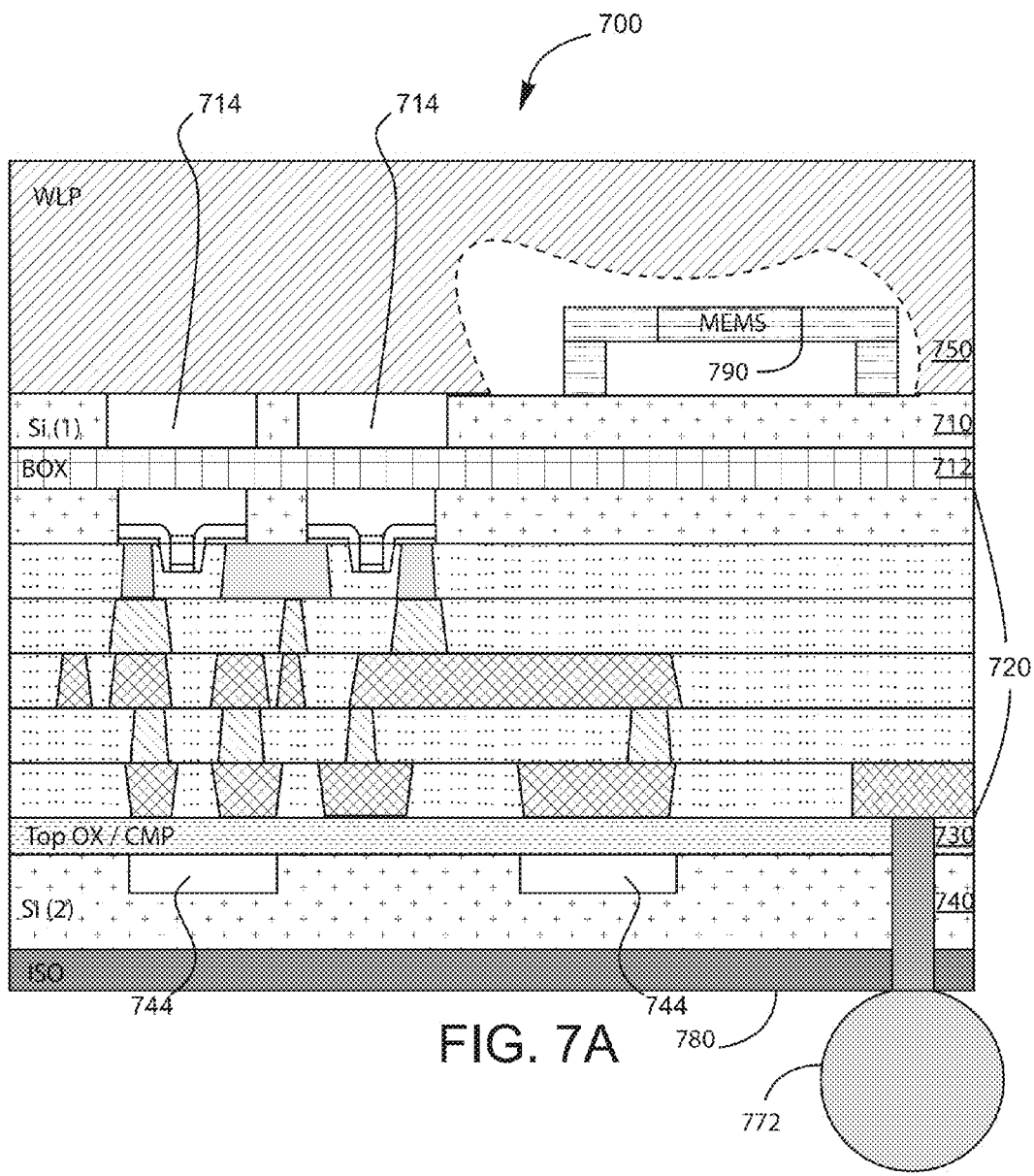
FIG. 7A is a simplified cross-section diagram of an integrated CMOS and MEMS device according to an embodiment of the present invention.
Figure 7B:
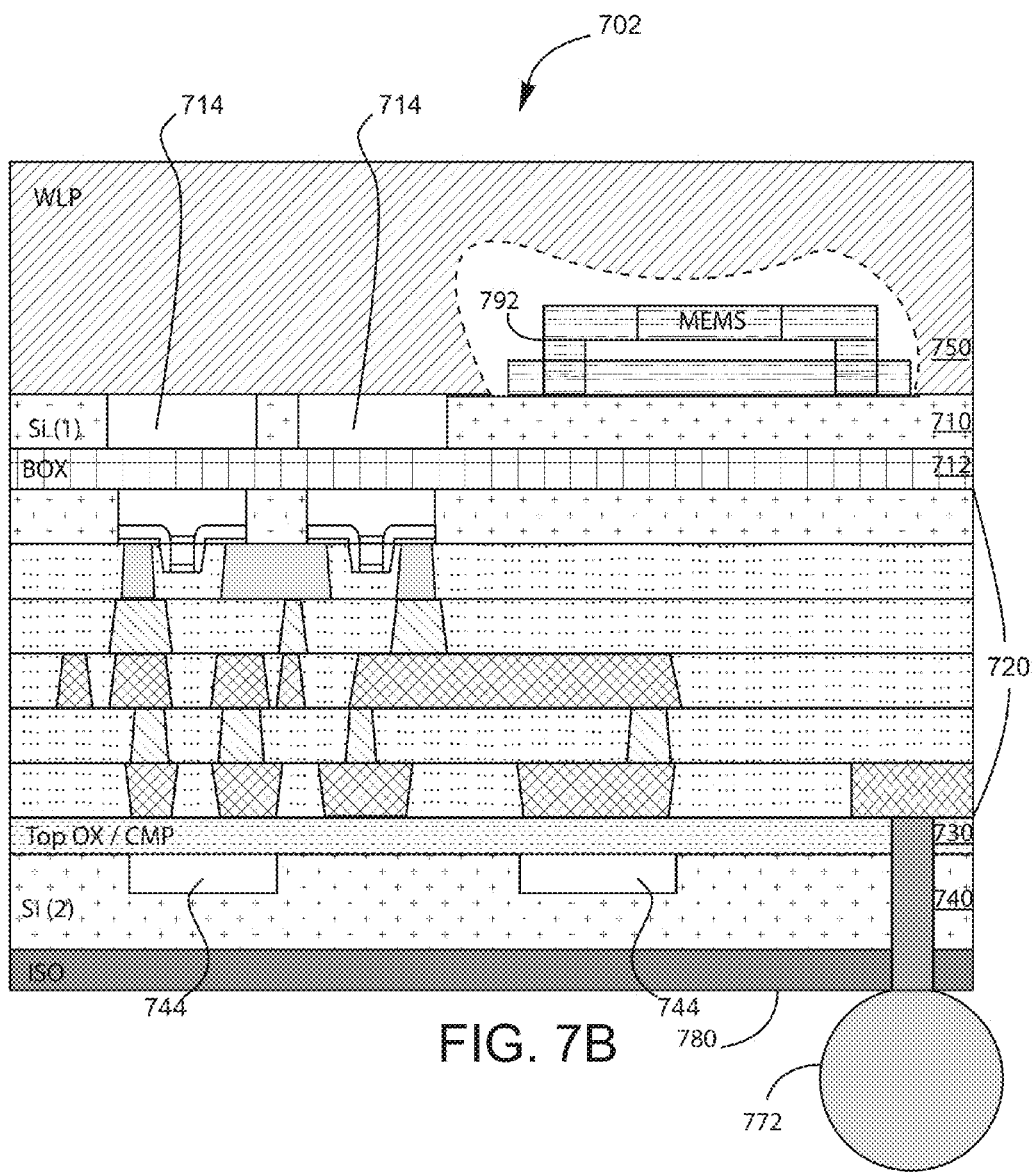
FIG. 7B is a simplified cross-section diagram of an integrated CMOS and MEMS device according to an embodiment of the present invention.
Figure 7C:
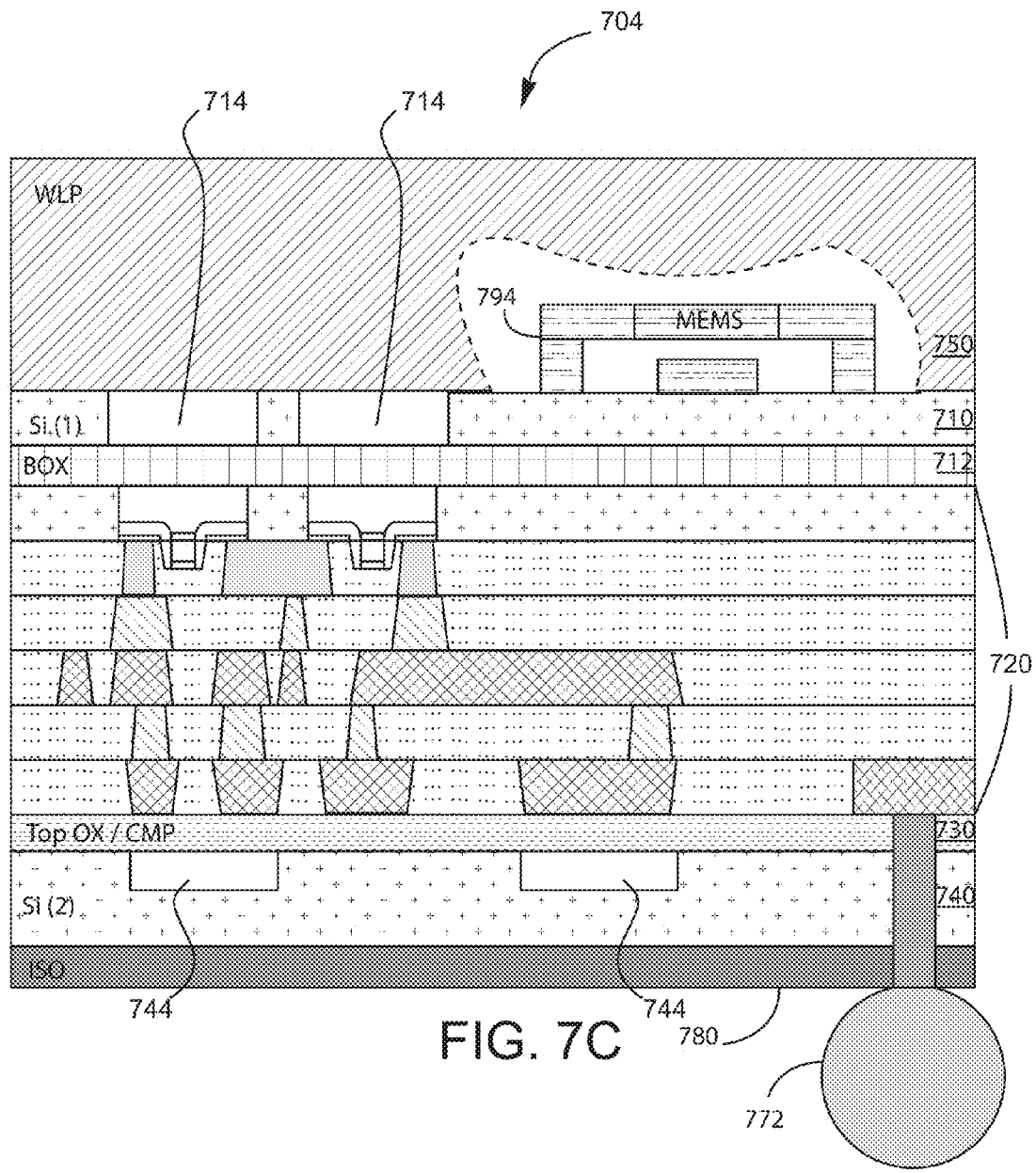
FIG. 7C is a simplified cross-section diagram of an integrated CMOS and MEMS device according to an embodiment of the present invention.
Figure 7D:
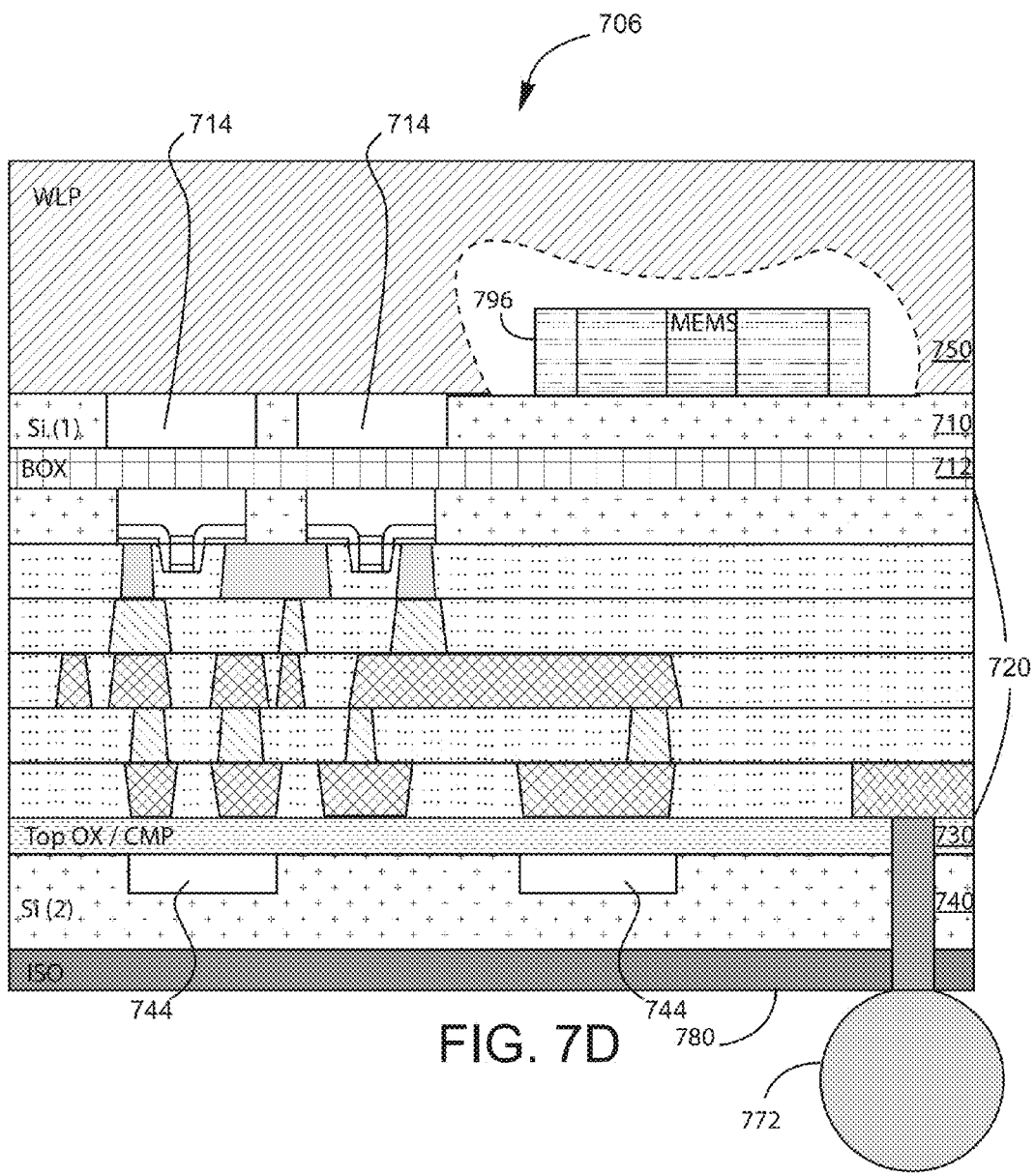
FIG. 7D is a simplified cross-section diagram of an integrated CMOS and MEMS device according to an embodiment of the present invention.

In an embodiment, one or more bonding structures can be operably coupled to each of devices 600, 602, 604, and 606. In a specific embodiment, a trench can be etched such that bonding pads 670 can be disposed on one or more portions of the top oxide layer, as shown in device 600 of FIG. 6A. In another specific embodiment, one or more bonding structures 672 can be operably coupled to device 602. Bonding structures 672 can have accessible regions overlying a portion of encapsulation layer 650, as shown in FIG. 6B. In another embodiment, one or more bonding structures 672 can be operably coupled to device 604. Bonding structures 672 can have accessible regions within one or more portions of the second semiconductor substrate, as shown in FIG. 6C. In the cases of FIGS. 6B and 6C, an isolation layer 680 is needed to separate the accessible regions of bonding structures 670 from the other device layers. In yet another embodiment, one or more bonding structures 674 can be operably coupled to device 606. Bonding structures 674 can have accessible regions within one or more portions of encapsulation layer 650. Each of bonding structures 672 and 674 can have a bonding pad, a via structure, and a pad structure, but can have other structures as well. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

FIGS. 7A-7D are simplified cross-section diagrams of an integrated CMOS and MEMS device according to an embodiment of the present invention. This diagram is merely an example, which should not unduly limit the scope of the claims herein. One of ordinary skill in the art would recognize other variations, modifications, and alternatives. As shown, each of devices 700, 702, 704, and 706 includes a thickness of silicon material 710, one or more CMOS integrated circuit (IC) devices 720, and a dielectric layer 730, a second semiconductor substrate 740, an encapsulation layer 750, one or more bonding structures, and one or more free standing MEMS structures. Components shown in these figures can represent a step in a method of fabricating an integrated CMOS and MEMS device using air dielectrics. Those of ordinary skill in the art will recognize other variations, modifications, and alternatives.

In an embodiment, the thickness of silicon material can be operably coupled to a BOX layer 712 to form a first semiconductor substrate. There can be different semiconductor substrate compositions and patterned etching processes can be applied to create one or more first air dielectric regions 714 within one or more portions of the first substrate and one or more second air dielectric regions 744 within one or more portions of the second substrate. Several types of encapsulation layers, such as wafer and thin film, can be applied depending on the type of application. Also, several types of bonding structures including bonding pads, via structures, and pad structures can and operably coupled to the integrated device to provide accessible connection points. Other variations, modifications, and alternatives regarding the first and second semiconductor substrate, the CMOS IC devices, dielectric layers and thinning processes have been discussed in the previous figures.

In an embodiment, one or more free standing MEMS structures can be formed within one or more portions of the desired thickness of the first semiconductor substrate. One or more MEMS structures can be configured to be supported by one or more members integrally formed on the desired thickness of the first semiconductor substrate. Each of devices 700, 702, 704, and 706 shows a specific type of MEMS device that can be formed within the first substrate. The MEMS structures can include a varactor 790, a switch 792, an inductor 794, a filter 796, and others. The MEMS structures can also include inertial sensors, pressure sensors, timing devices, and rf devices, but can be others as well. There can be other variations, modifications, and alternatives.

In a specific embodiment, a sacrificial layer can be formed overlying the one or more free standing MEMS structures. An enclosure layer can then be formed overlying the sacrificial layer. The enclosure layer can have one or more openings to expose one or more portions of the sacrificial layer. In a specific embodiment, the enclosure layer can include a titanium material, which can be activated as a getter layer. In other embodiments, the enclosure layer can include a material selected from a metal, a semiconductor material, and amorphous silicon material, a dielectric layer, or a combination of these layers, and other materials as well. Of course, there can be other variations, modifications, and alternatives.

In an embodiment, the sacrificial layer can be removed via an ashing process to form an open region between the one or more free standing MEMS structures and the enclosure layer. Also, an encapsulating layer can be formed overlying the enclosure layer to substantially seal the one or more free standing MEMS structures to form a predetermined environment within the open region. In a specific embodiment, the predetermined environment can include an inert gaseous environment at a determined pressure. Also, the encapsulating layer can be selected from a metal layer, a spin on glass, a spray on glass, amorphous silicon, a dielectric layer, or any combination of these layers. In an embodiment, the enclosure layer can be configured overlying a first outer region of the desired thickness of the first substrate. The enclosure can have an upper cover region. One or more bonding structures 772 can be formed within a vicinity of the upper cover region and provided within a second outer region of the thickness of the first substrate. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 8:
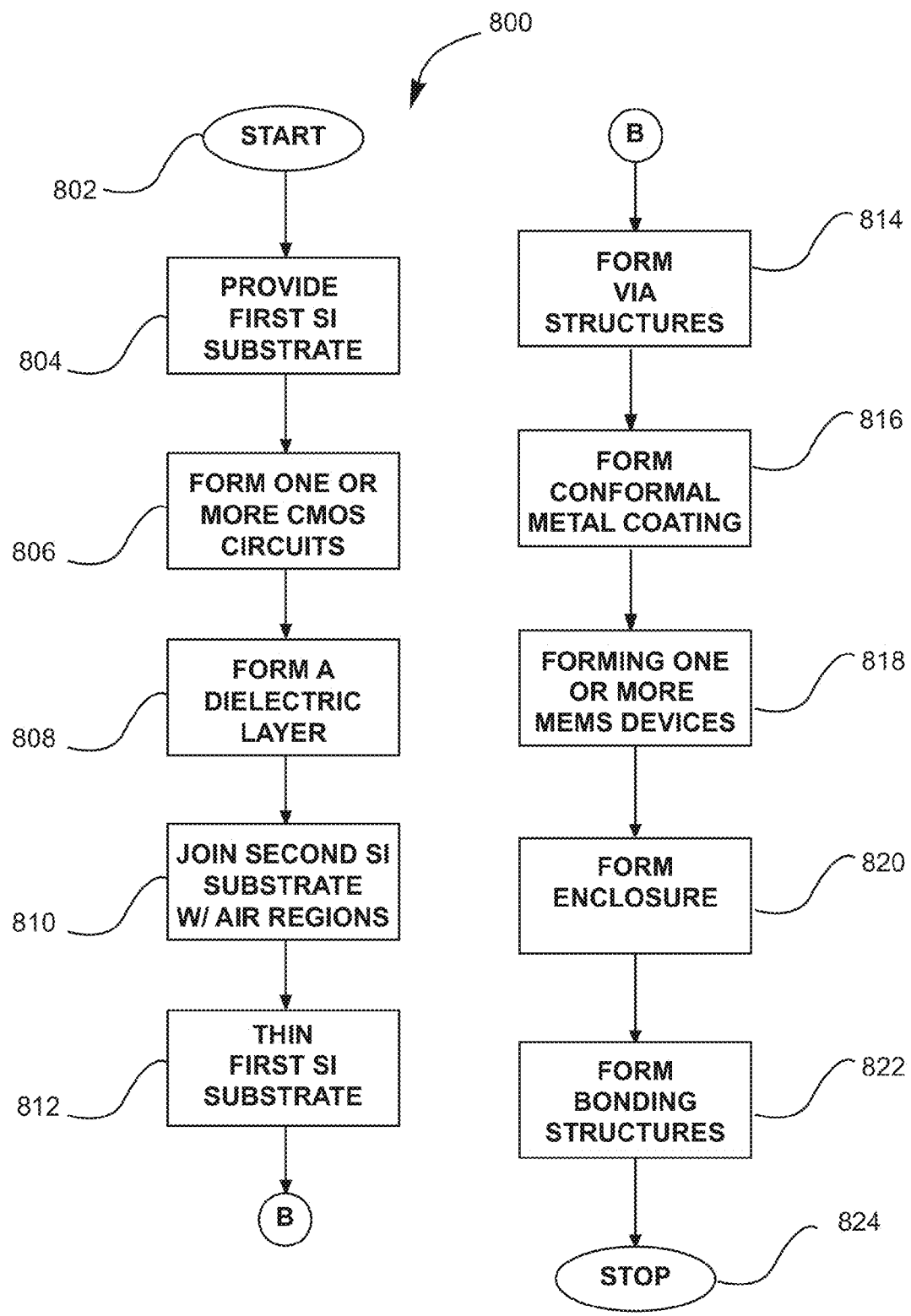
FIG. 8 is a simplified flow diagram of an integrated CMOS and MEMS device fabrication method according to an embodiment of the present invention.

FIG. 8 is a simplified flow diagram illustrating a method of fabricating an integrated CMOS and MEMS device using air dielectrics according to an embodiment of the present invention. This diagram is merely an example, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

As shown in FIG. 8, the present method can be briefly outlined below.

1. Start;
2. Provide a first semiconductor substrate;
3. Form one or more CMOS circuits overlying the first substrate;
4. Form a dielectric layer overlying the CMOS circuits;
5. Join a second semiconductor substrate with air dielectric to the dielectric layer;
6. Thin the first semiconductor substrate;
7. Form one or more via structures;
8. Form a conformal metal coating within the via structures;
9. Form one or more MEMS devices;

10. Form an enclosure housing the MEMS devices;
11. Form bonding structures; and
12. Stop.

These steps are merely examples and should not unduly limit the scope of the claims herein. As shown, the above method provides a way of fabricating an integrated CMOS and MEMS device using air dielectrics according to an embodiment of the present invention. One of ordinary skill in the art would recognize many other variations, modifications, and alternatives. For example, various steps outlined above may be added, removed, modified, rearranged, repeated, and/or overlapped, as contemplated within the scope of the invention.

As shown in FIG. 8, method 800 begins at start, step 802. The present method provides a fabrication method for forming an integrated CMOS and MEMS device using air dielectrics. Many benefits are achieved by way of the present invention over conventional techniques. For example, the present technique provides an easy to use process that relies upon conventional technology. In some embodiments, the method provides higher device yields in dies per wafer with the integrated approach. Additionally, the method provides a process and system that are compatible with conventional process technology without substantial modifications to conventional equipment and processes. Preferably, the invention provides for an improved integrated MEMS and CMOS circuit device and related methods for a variety of uses. Depending upon the embodiment, one or more of these benefits may be achieved. These and other benefits will be described in more throughout the present specification and more particularly below.

Following step 802, fabrication method 800 involves providing a first semiconductor substrate having a first surface region, step 804. In an embodiment, a layer of material can be spatially disposed overlying the thickness of silicon material to form a first semiconductor substrate. In a specific embodiment, the layer of material disposed overlying the thickness of silicon material can be a buried oxide (BOX) layer. In another specific embodiment, the layer of material disposed overlying the thickness of silicon material can be an epitaxial (EPI) layer or the first semiconductor substrate can have just the thickness of silicon material. In further embodiments, the first and second semiconductor substrate can have a silicon, single crystal silicon, or polycrystalline silicon material. Those skilled in the art will recognize other variations, modifications, and alternatives.

In an embodiment, the first semiconductor substrate can have a first surface region and a CMOS device region can be a region overlying the first surface region. One or more CMOS IC devices can be formed on the CMOS IC device region overlying the first surface region, step 806. The CMOS IC device region can have a CMOS surface region. In a specific embodiment, the one or more CMOS IC devices can include transistor devices, metal layers, via structures, and others. In further embodiments, additional transistors, metal layers, and structures can be added. The fabrication of the one or more CMOS IC devices can be done through foundry-compatible processes. Of course, there can be other variations, modifications, and alternatives.

Following the formation of CMOS IC devices, a dielectric layer can be formed overlying the CMOS surface region, step 808. The dielectric layer can have one or more patterned regions. In a specific embodiment, the dielectric layer can be a top oxide layer or formed via a chemical mechanical planarization (CMP) process. As stated previously, there can be other variations, modifications, and alternatives.

After the dielectric layer is formed, a second semiconductor substrate can be joined to the CMOS surface region by bonding the second surface region to the dielectric layer, step 810. The second semiconductor substrate can have a second surface region. Also, the second semiconductor substrate can be patterned such that one or more portions of the second substrate within a vicinity of the one or more CMOS IC devices are removed in order to form one or more first air dielectric regions. Again, there can be other variations, modifications, and alternatives.

After joining the second substrate, the first substrate can be thinned to a desired thickness while maintaining attachment to the CMOS IC device region, step 812. In a specific embodiment, the thinning can include a grinding process to remove a thickness of material from the first semiconductor substrate to expose a ground surface region. This process can be done by removing a portion of the thickness of silicon material without removing any portion the BOX layer. In other embodiments, this process can be done by removing a portion of the thickness of silicon material without removing any portion of the EPI layer or without removing material from the CMOS IC device region.

In a specific embodiment, the thinning can include subjecting the ground surface region to a polishing process to smooth the ground surface region to a predetermined surface roughness. During either or both the grinding process and/or the polishing process, the thickness of the first substrate can be monitored. In a specific embodiment, the monitoring includes using an interferometer process to measure an indication associated with the thickness of the first semiconductor substrate. The interferometer process can use an electromagnetic radiation in an infrared wavelength range. In a specific embodiment, the polishing process can include a blanket etching process.

Also, the thinning can include cleaving a portion of the first semiconductor substrate at a cleave region to remove the desired thickness from the first substrate. The cleave region can be within a vicinity of the desired thickness, which is a remaining portion of the first substrate that is still attached to the CMOS IC device region. In another specific embodiment, the first substrate can be an SOI substrate including a bulk portion, overlying insulating layer, and single crystal device layer. The thinning can include selectively removing a portion of the SOI substrate from the single crystal device layer while maintaining attachment to the CMOS IC device region. In another specific embodiment, the thinning can include a patterned etching process such that one or more portions of the first semiconductor substrate within a vicinity of one or more CMOS IC devices are removed to form one or more second air dielectric regions. Again, there can be other variations, modifications, and alternatives.

After the desired thickness of the first substrate remains, one or more via structures can be formed within one or more portions of the desired thickness of the first substrate, step 814. In a specific embodiment, one or more via structures can extend from one or more portions of the CMOS IC device region to a vicinity of the desired thickness of the first substrate. The one or more via structures can be configured as one or more stop structures to form one or more end point regions of the thinning. Additionally, a conformal coating of metal material can be formed within the one or more via structures, step 816. Of course, there can be other variations, modifications, and alternatives.

Following the formation of the metal coating, one or more free standing MEMS structures can be formed within one or more portions of the desired thickness of the first semiconductor substrate, step 818. One or more MEMS structures can be configured to be supported by one or more members integrally formed on the desired thickness of the first semiconductor substrate. The MEMS structures can include a varactor, a switch, an inductor, a filter, and others. The MEMS structures can also include inertial sensors, pressure sensors, timing devices, and rf devices, but can be others as well. There can be other variations, modifications, and alternatives.

After the MEMS device are formed, an enclosure layer can be formed overlying the first semiconductor substrate, step 820. In a specific embodiment, the enclosure layer can be a WLP layer, which can include a layer of material bonded to the first substrate. In another specific embodiment, the WLP layer can be a thin film of material deposited overlying the first substrate. Those skilled in the art will recognize other variations, modifications, and alternatives.

In an embodiment, one or more bonding structures can be formed within one or more portions of the integrated device. In a specific embodiment, a trench can be etched such that the bonding pads can be disposed on one or more portions of the top oxide layer. In another specific embodiment, the one or more bonding structures can be operably coupled to the integrated device. The bonding structures can have accessible regions overlying a portion of the enclosure layer. In another embodiment, the one or more bonding structures can be operably coupled to the integrated device. The bonding structures can have accessible regions within one or more portions of the second semiconductor substrate. In these cases with accessible regions, an isolation layer is needed to separate the accessible regions of the bonding structures from the other device layers. In yet another embodiment, the one or more bonding structures can be operably coupled to the integrated device. The bonding structures can have accessible regions within one or more portions of the enclosure layer. Each of the bonding structures can have a bonding pad, a via structure, and a pad structure, but can have other structures as well. Of course, there can be other variations, modifications, and alternatives.

The above sequence of processes provides a fabrication method for forming an integrated CMOS and MEMS device according to an embodiment of the present invention. As shown, the method uses a combination of steps including providing a first substrate, forming CMOS devices, forming a dielectric layer, joining a second substrate with patterned air dielectric regions to the dielectric layer, thinning the first substrate, forming via structures, forming a conformal metal coating within the via structures, and forming one or more free standing MEMS structures, and forming an enclosure. Other alternatives can also be provided where steps are added, one or more steps are removed, or one or more steps are provided in a different sequence without departing from the scope of the claims herein. Further details of the present method can be found throughout the present specification.

What is claimed is:

1. A method for fabricated a monolithic integrated CMOS and MEMS device, the method comprising:
providing a first semiconductor substrate having a first surface region;
forming one or more CMOS integrated circuit devices provided on a CMOS integrated circuit device region overlying the first surface region, the CMOS integrated circuit device region having a CMOS surface region;
forming a dielectric layer overlying the CMOS surface region;
joining a second semiconductor substrate having a second surface region to the CMOS surface region by bonding the second surface region to the dielectric layer, the second semiconductor being patterned such that one or more portions of the second semiconductor substrate within a vicinity of the one or more CMOS integrated devices are removed to form one or more first air dielectric regions;
thinning the first substrate to a desired thickness while maintaining attachment to the CMOS integrated device region; and
forming one or more free standing MEMS structures overlying one or more portions of the desired thickness of the first semiconductor substrate.

2. The method of claim 1 wherein the first semiconductor substrate is selected from a group consisting of: a buried oxide (BOX), layer overlying a silicon substrate, an epitaxial (EPI) layer overlying a silicon substrate, an amorphous silicon substrate, a single crystal silicon substrate, and a polycrystalline silicon substrate.

3. The method of claim 1 wherein the dielectric layer is a top oxide layer.

4. The method of claim 1 wherein the dielectric layer is formed via a chemical mechanical planarization (CMP) process.

5. The method of claim 1 wherein the thinning comprises:
using a grinding process to remove a thickness of material from the first semiconductor substrate to expose a ground surface region;
subjecting the ground surface region to a polishing process to smooth the ground surface region to a predetermined surface roughness; and
monitoring a thickness of the first substrate during either or both the grinding process and/or the polishing process.

6. The method of claim 5 wherein the monitoring comprises using an interferometer process to measure an indication associated with the thickness of the first semiconductor substrate, the interferometer process using an electromagnetic radiation in an infrared wavelength range.

7. The method of claim 1 wherein the thinning process comprises a grinding process to remove a thickness of material from the first semiconductor substrate to expose a ground surface region; and further comprising applying a blanket etching process to the first semiconductor substrate.

8. The method of claim 1 wherein the thinning comprises a grinding process to remove a thickness of material from the first semiconductor substrate to expose a ground surface region; and further comprising a patterned etching process such that one or more portions of the first semiconductor substrate within a vicinity of the one or more CMOS integrated circuit devices are removed to form one or more second air dielectric regions.

9. The method of claim 1 further comprising forming one or more via structures within one or more portions of the first semiconductor substrate, the one or more via structures extending from one or more portions of the CMOS integrated circuit device region to a vicinity of the desired thickness of the first semiconductor substrate, the one or more via structures being configured as one or more stop structures to form one or more end point regions of the thinning.

10. The method of claim 1 wherein the first semiconductor substrate is an SOI substrate comprising a bulk portion, overlying insulating layer, and a single crystal device layer; and wherein the thinning comprises selectively removing the bulk portion of the SOI substrate from the single crystal device layer while maintaining attachment to the CMOS integrated circuit device region.

11. The method of claim 1 wherein the thinning comprises cleaving a portion of the first semiconductor substrate at a cleave region to remove the desired thickness from the first semiconductor substrate, the cleave region being within a vicinity of the desired thickness, the desired thickness being a remaining portion of the first semiconductor substrate attached to the CMOS integrated circuit device region.

12. The method of claim 1 wherein the CMOS integrated circuit device region is formed using a standing CMOS process from a semiconductor foundry.

13. The method of claim 1 further comprising forming a sacrificial layer overlying the one or more free standing MEMS structures.

14. The method of claim 13 further comprising forming an enclosure layer overlying the sacrificial layer, the enclosure layer having one or more openings to expose one or more portions of the sacrificial layer.

15. The method of claim 14 wherein the enclosure layer comprises a titanium material, the titanium material being activated as a getter layer.

16. The method of claim 14 wherein the enclosure layer is selected from a group consisting of: a metal material, a semiconductor material, an amorphous silicon material, and a dielectric material.

17. The method of claim 14 further comprising removing the sacrificial layer via an ashing process to form an open region between the one or more free standing MEMS structures and the enclosure layer; and forming an encapsulating layer overlying the enclosure layer to substantially seal the one or more free standing MEMS structures to form a predetermined environment within the open region.

18. The method of claim 17 wherein the encapsulating layer is selected from a group consisting of: a metal layer, a spin on glass, a spray on glass, amorphous silicon, and a dielectric layer.

19. The method of claim 17 wherein the encapsulating layer is formed overlying the sacrificial layer overlying the one or more free standing MEMS structures.

20. The method of claim 17 wherein the predetermined environment comprises an inert gas at a determined pressure.

21. The method of claim 14 further comprising forming one or more bond pad openings to expose one or more bond pads coupled to the CMOS device layer.

22. The method of claim 1 further comprising forming an enclosure housing the one or more free standing MEMS structures, the enclosure configured overlying a first outer region of the desired thickness of the first semiconductor substrate, the enclosure having an upper cover region.

23. The method of claim 22 further comprising forming one or more bonding structures, each of the bonding structures having a bonding pad within a vicinity of the upper cover region and provided within a second outer region of the thickness of the first semiconductor substrate.

24. The method of claim 1 wherein the one or more MEMS devices are selected from a group consisting of: an accelerometer, a gyroscope, a magnetic sensor, a pressure sensor, a microphone, a humidity sensor, a temperature sensor, a chemical sensor, a biosensor, and an inertial sensor.

25. The method claim 1 wherein the one or more bonding structures comprises the bonding pad, a via structure, and a pad structure, the pad structure being integrally coupled to the one or more CMOS integrated circuit devices.

26. The method of claim 1 wherein each of the bonding structures is spatially disposed such that a spacing is provided between each of the bonding structures and the enclosure.

27. The method of claim 1 wherein the one or more free standing MEMS structures are spatially disposed such that there is an opening provided between the enclosure and the one or more free standing MEMS structures.

28. The method of claim 27 wherein the opening is filled with one or more gases.

* * * * *